United States Patent
Nagai

(10) Patent No.: US 8,492,776 B2
(45) Date of Patent: Jul. 23, 2013

(54) SEMICONDUCTOR LIGHT EMITTING DEVICE, ILLUMINATION MODULE, ILLUMINATION APPARATUS, METHOD FOR MANUFACTURING SEMICONDUCTOR LIGHT EMITTING DEVICE, AND METHOD FOR MANUFACTURING SEMICONDUCTOR LIGHT EMITTING ELEMENT

(75) Inventor: Hideo Nagai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/967,185

(22) Filed: Dec. 14, 2010

(65) Prior Publication Data

US 2011/0079795 A1 Apr. 7, 2011

Related U.S. Application Data

(62) Division of application No. 11/720,258, filed as application No. PCT/JP2005/024007 on Dec. 21, 2005, now Pat. No. 7,906,788.

(30) Foreign Application Priority Data

Dec. 22, 2004 (JP) .................................. 2004-372319
Oct. 21, 2005 (JP) .................................. 2005-307575

(51) Int. Cl.
*H01L 29/18* (2006.01)
(52) U.S. Cl.
USPC ........................ 257/88; 257/E33.033; 438/33
(58) Field of Classification Search
USPC ............................... 257/88, E33.033; 438/33
See application file for complete search history.

(56) References Cited

U.S. PATENT DOCUMENTS

| 5,171,717 | A | 12/1992 | Broom et al. |
| 5,289,082 | A | 2/1994 | Komoto |
| 6,613,461 | B1 | 9/2003 | Sugahara |
| 6,803,603 | B1 * | 10/2004 | Nitta et al. ........................ 257/79 |
| 2002/0063258 | A1 | 5/2002 | Motoki |
| 2002/0113244 | A1 | 8/2002 | Barnett et al. |

(Continued)

FOREIGN PATENT DOCUMENTS

| EP | 0 961 328 | 12/1999 |
| JP | 091006965 | 4/1997 |

(Continued)

OTHER PUBLICATIONS

Japanese Application No. 2007-524694 Office Action dated Jan. 17, 2012, 2 pages.

(Continued)

*Primary Examiner* — Julio J Maldonado
*Assistant Examiner* — Hajar Kolahdouzan

(57) ABSTRACT

A semiconductor light emitting device (10) is provided with a base substrate (12) and three LED chips (14A, 14B, and 14C) disposed on the base substrate (12). Each LED chip (14A, 14B, and 14C) includes a semiconductor multilayer structure (20) and has a rhombus shape with interior angles of approximately 60° and approximately 120° in plan view. Each semiconductor multilayer structure (20) has an HCP single crystal structure and includes a light emission layer (24). The LED chips (14A, 14B, and 14C) are arranged on the base substrate (12) so as to face one another at a vertex forming the larger interior angle in plan view. With this arrangement, the LED chips (14A, 14B, and 14C) as a whole form a substantially regular hexagonal shape.

18 Claims, 31 Drawing Sheets

U.S. PATENT DOCUMENTS

| | | | |
|---|---|---|---|
| 2002/0113246 A1* | 8/2002 | Nagai et al. | 257/99 |
| 2002/0189532 A1* | 12/2002 | Motoki et al. | 117/99 |
| 2003/0193789 A1 | 10/2003 | Karlicek | |
| 2004/0195578 A1 | 10/2004 | Kim | |
| 2004/0266043 A1* | 12/2004 | Oohata et al. | 438/46 |
| 2005/0127388 A1 | 6/2005 | Lin et al. | |
| 2005/0179130 A1* | 8/2005 | Tanaka et al. | 257/730 |
| 2005/0253151 A1 | 11/2005 | Sakai et al. | |
| 2006/0091409 A1 | 5/2006 | Epler et al. | |
| 2006/0113548 A1 | 6/2006 | Chen et al. | |
| 2006/0244356 A1* | 11/2006 | Nagatomi et al. | 313/485 |
| 2006/0261364 A1 | 11/2006 | Suehiro et al. | |

FOREIGN PATENT DOCUMENTS

| | | |
|---|---|---|
| JP | 10-044139 | 2/1998 |
| JP | 10-214997 | 8/1998 |
| JP | 11-340576 | 10/1999 |
| JP | 11-340507 | 12/1999 |
| JP | 2001-15817 | 1/2001 |
| JP | 2001-168388 | 6/2001 |
| JP | 2001-351404 | 12/2001 |
| JP | 2002-368262 | 12/2002 |

OTHER PUBLICATIONS

Torvik, John T. et al., "Optical Properties of GaN Grown Over SiO2 on SiC Substrates by Molecular Beam Epitaxy", 1998 American Institute of Physics, Appl. Phys. Lett. 72 92), Jan. 12, 1998, pp. 244-245.

* cited by examiner

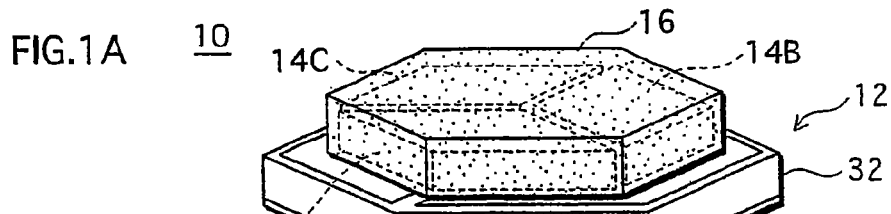
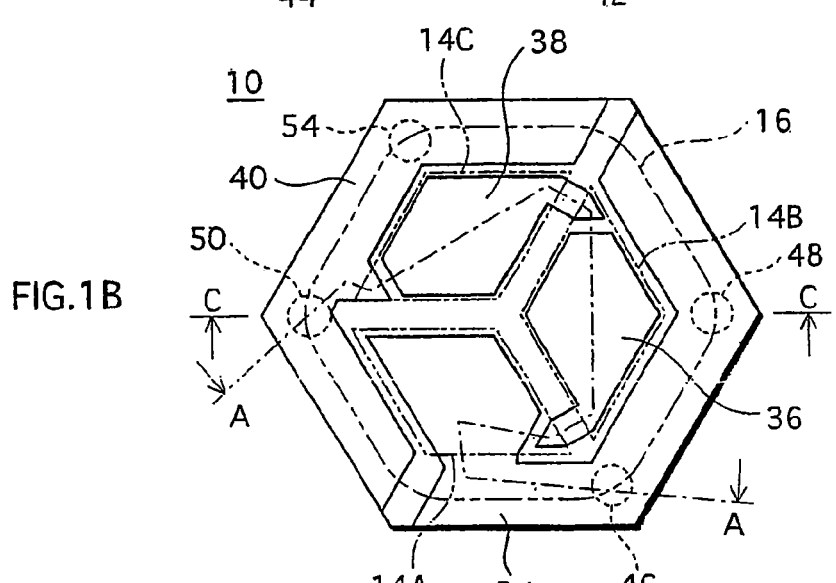
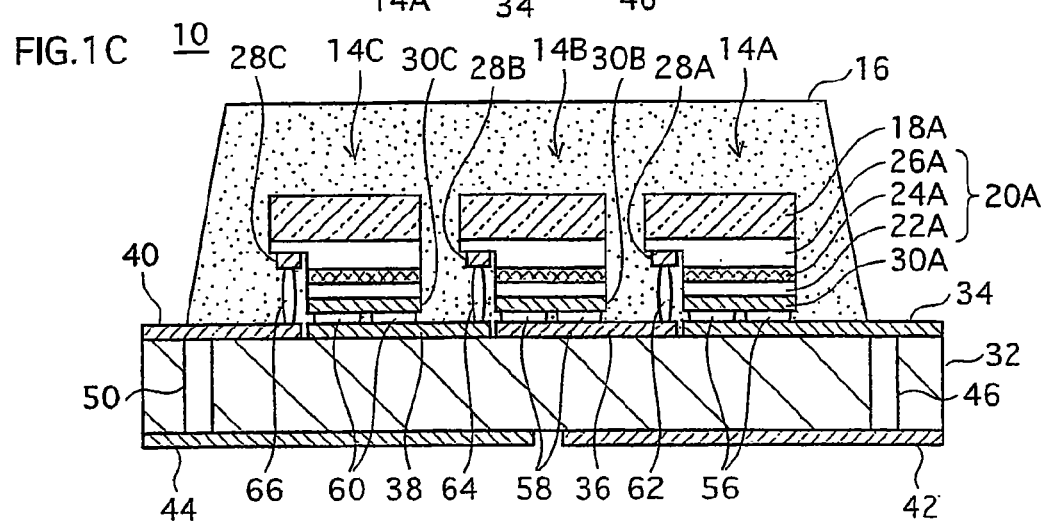

FIG. 3
STEP A1
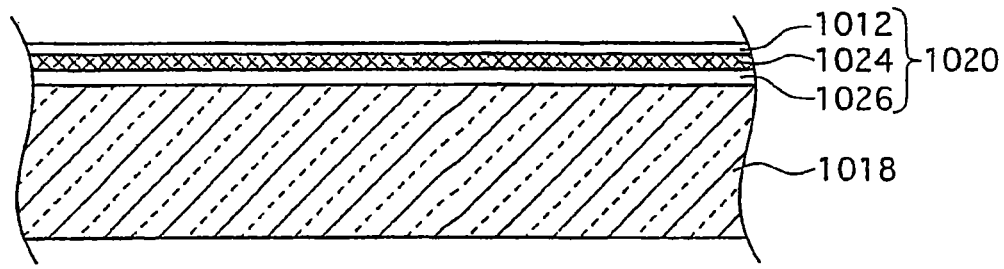
STEP B1
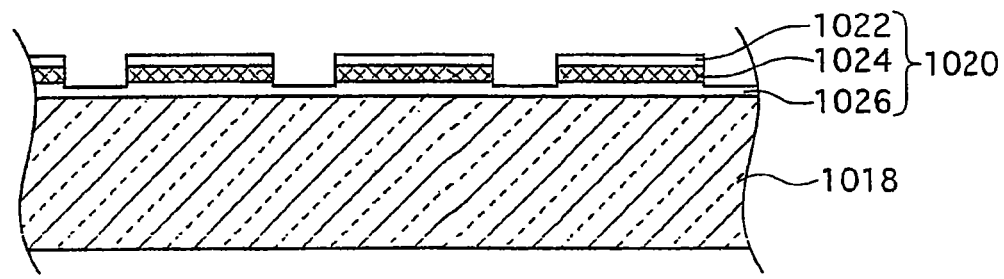
STEP C1
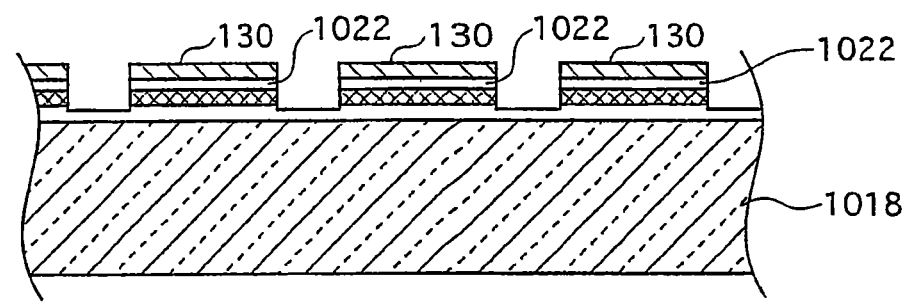
STEP D1
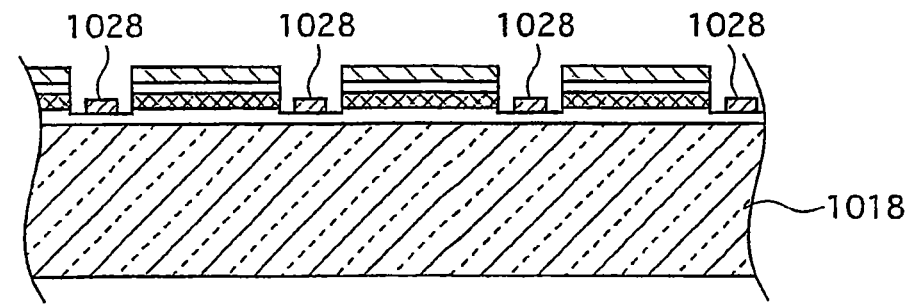

FIG.4
STEP E1
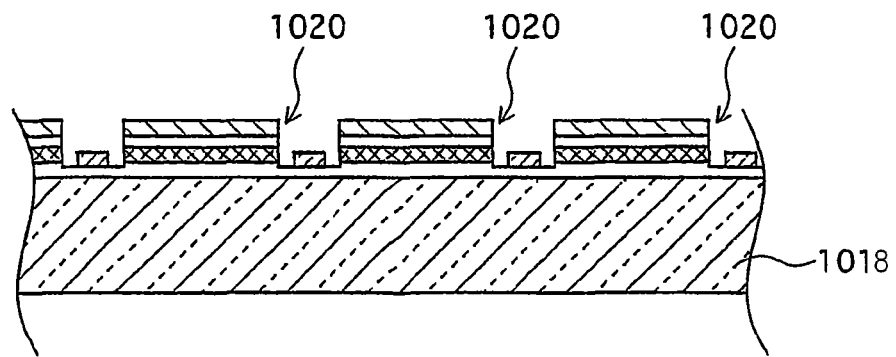
STEP F1
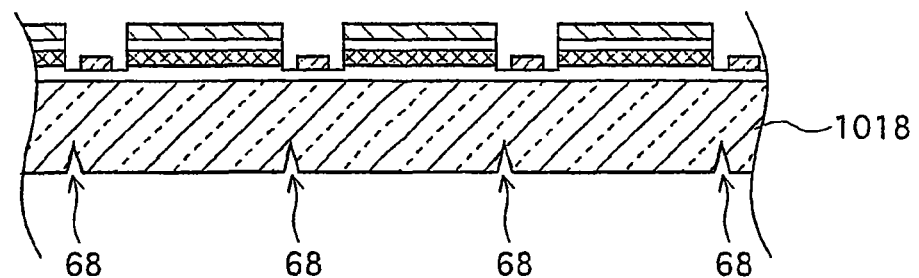
STEP G1
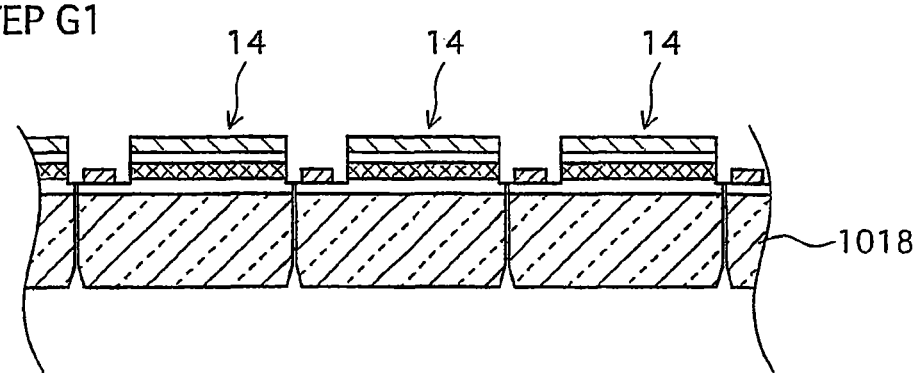

ENLARGED PORTION B

FIG.6
STEP H1
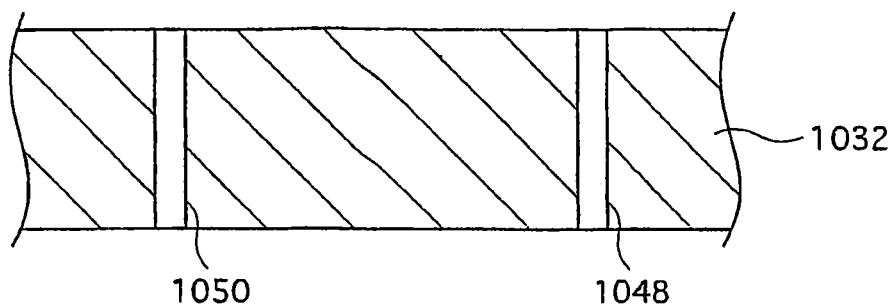
STEP J1
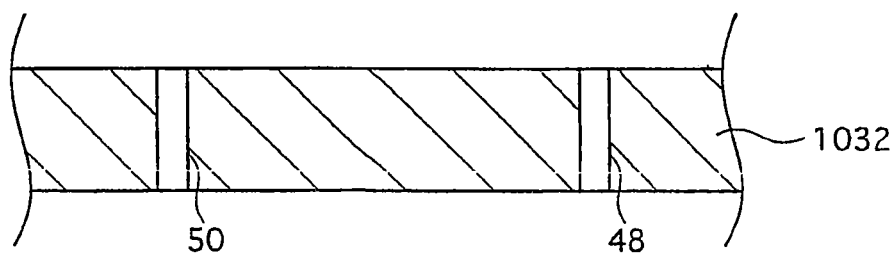
STEP K1
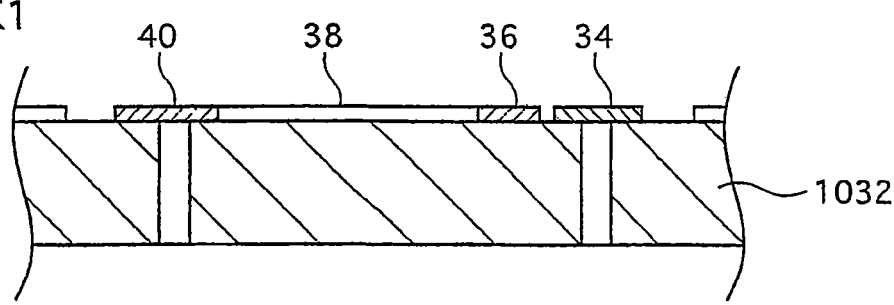
STEP L1
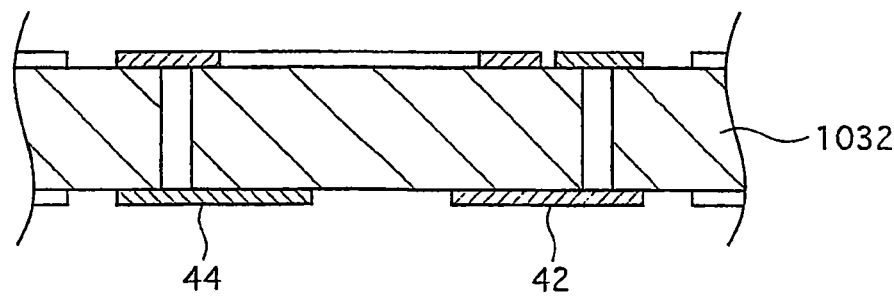

FIG.7
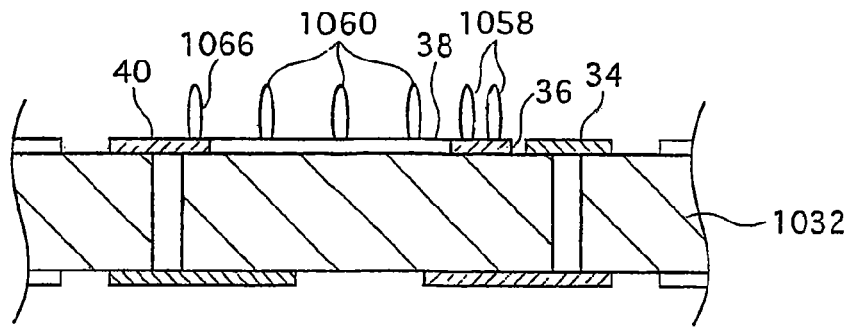
STEP M1
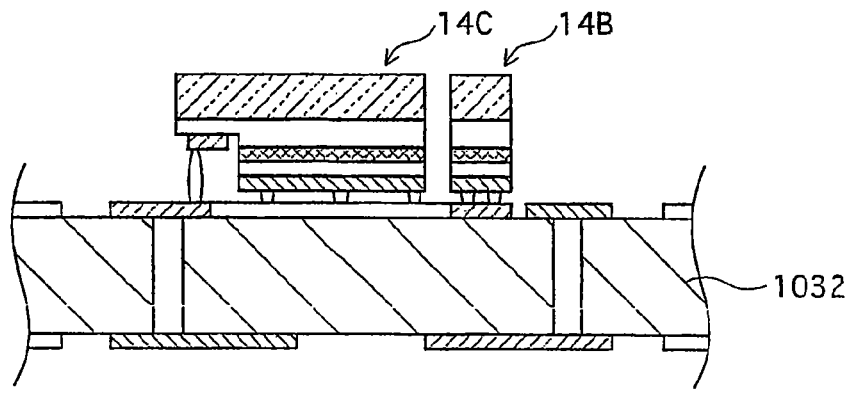
STEP N1
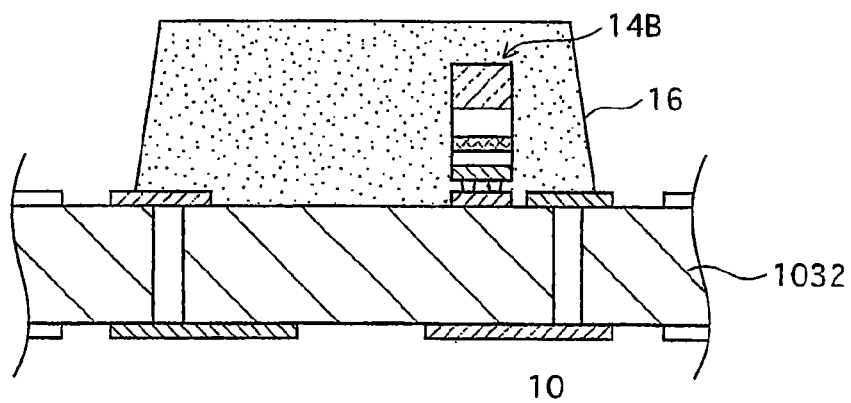
STEP Q1
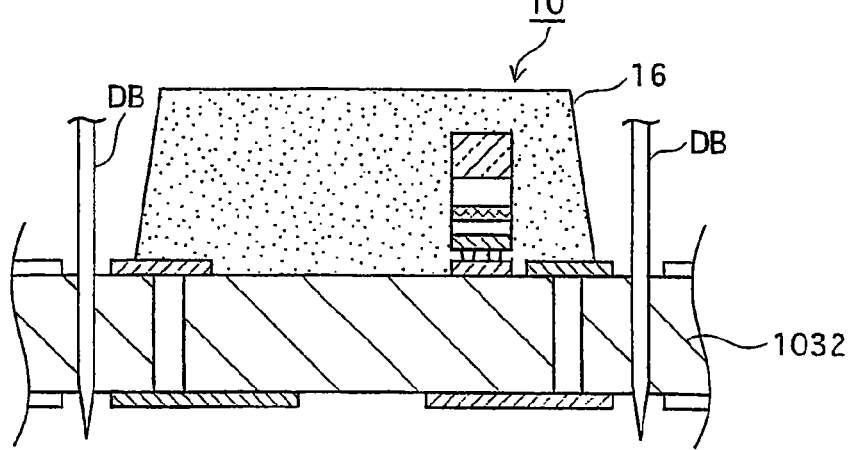
STEP R1

FIG. 10
STEP A2
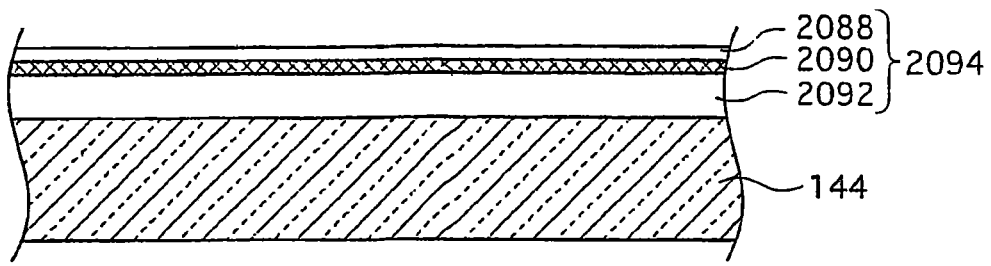
STEP B2
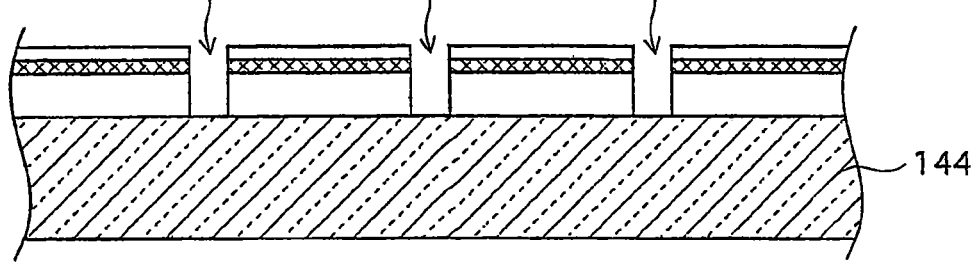
STEP C2
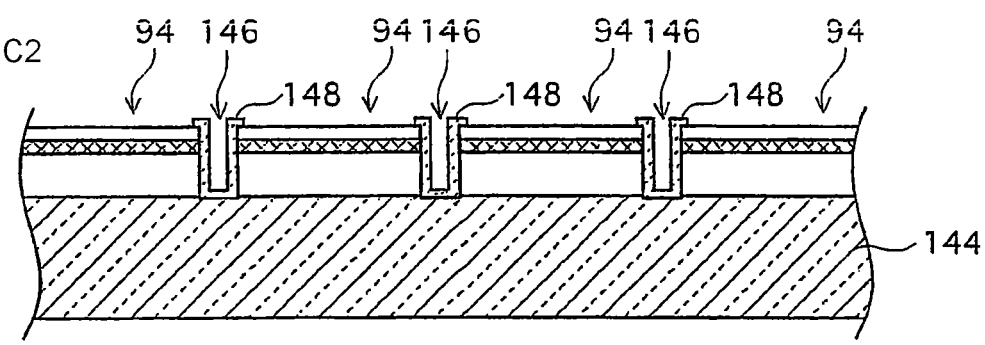
STEP D2
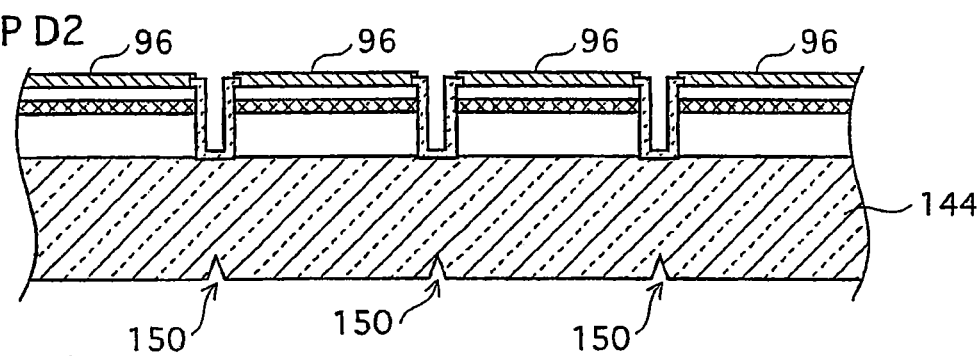
STEP E2
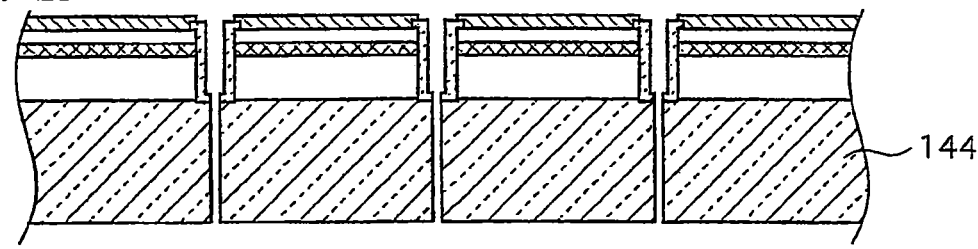

ENLARGED PORTION F

FIG. 12
STEP F2
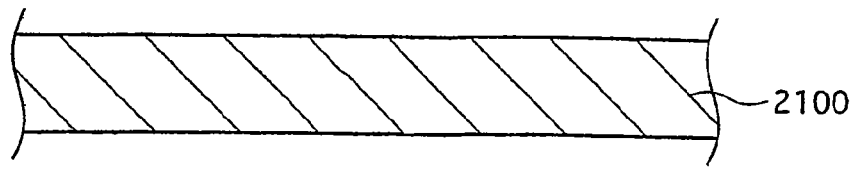
STEP G2
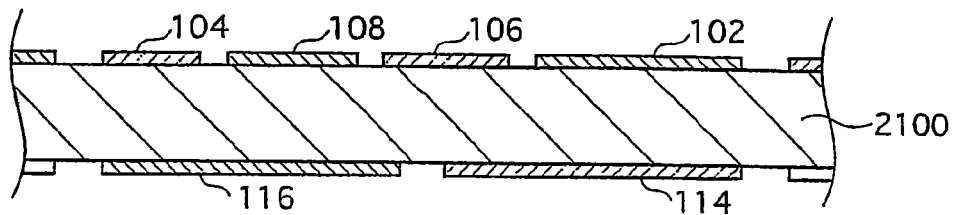
STEP H2
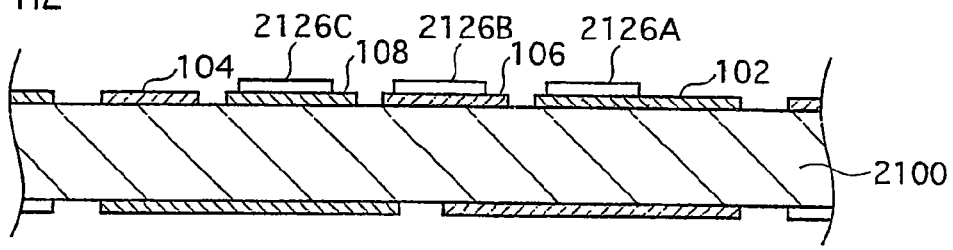
STEP J2
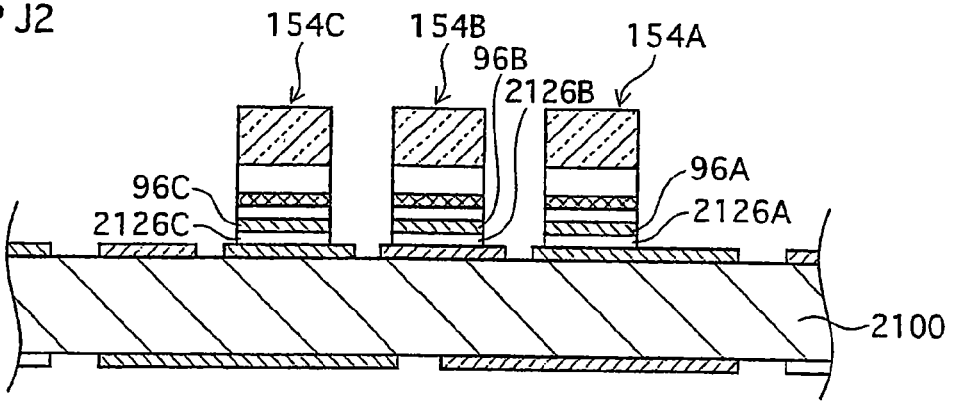
STEP K2
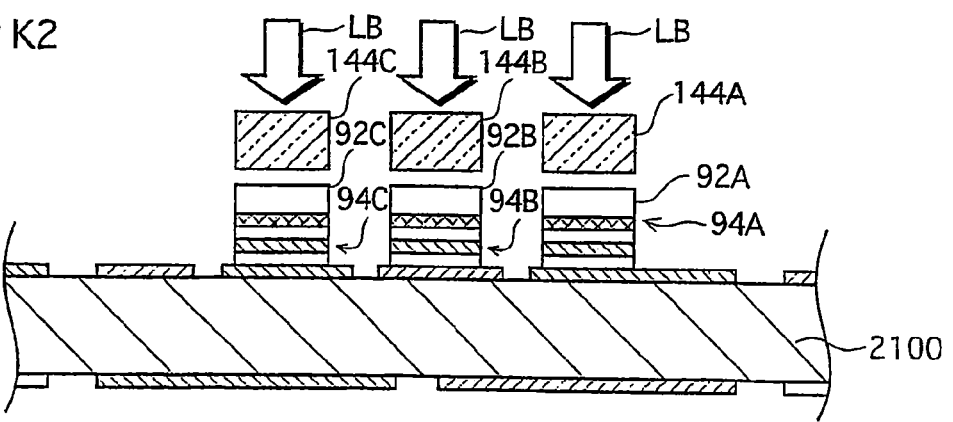

FIG.13
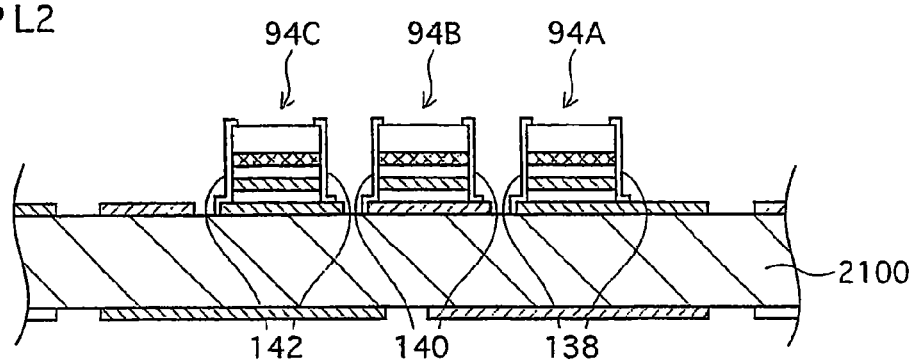
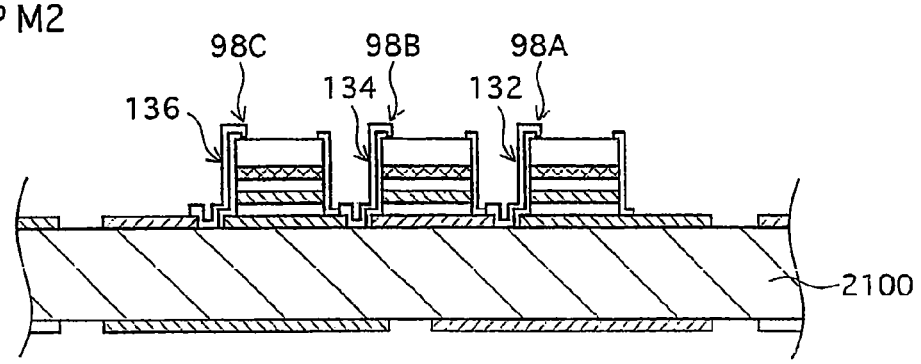
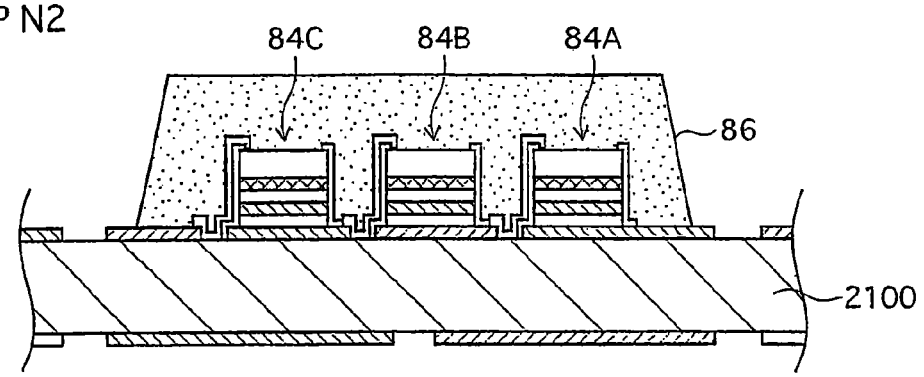
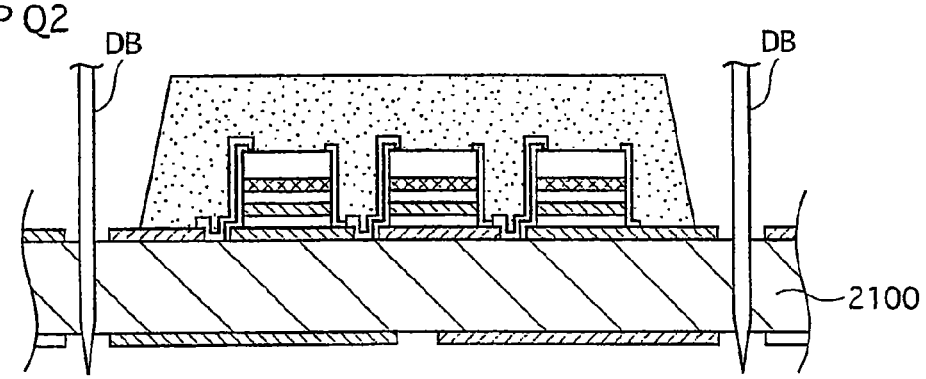

FIG.15
STEP A3
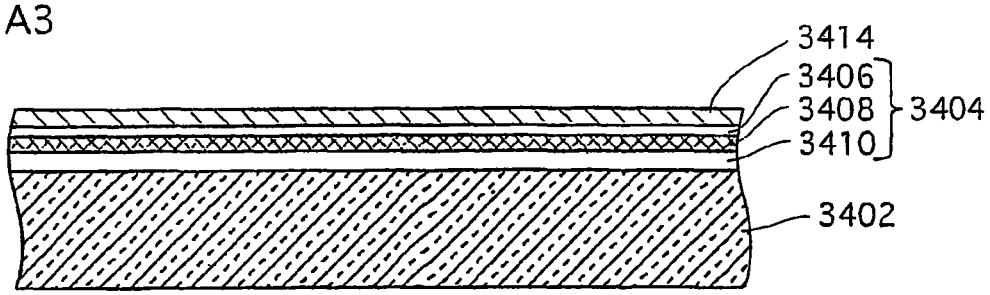
STEP B3
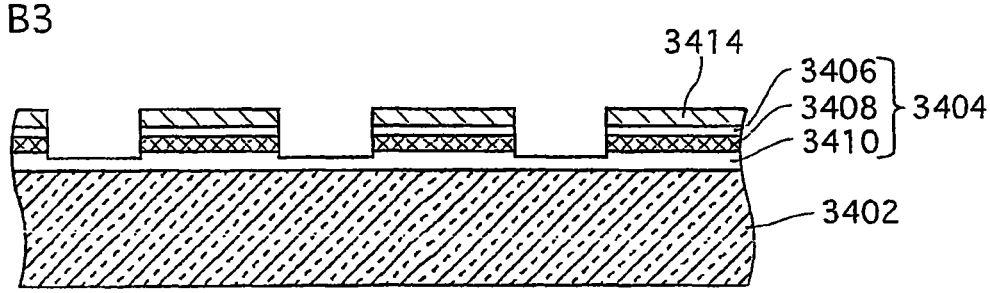
STEP C3
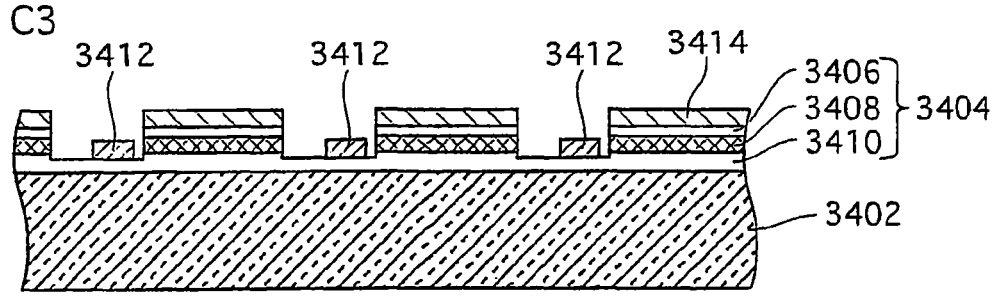
STEP D3
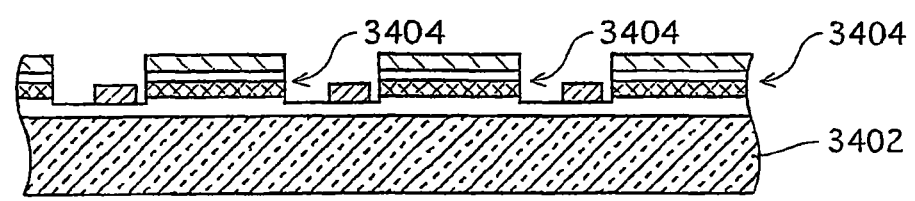

FIG.17
STEP E3
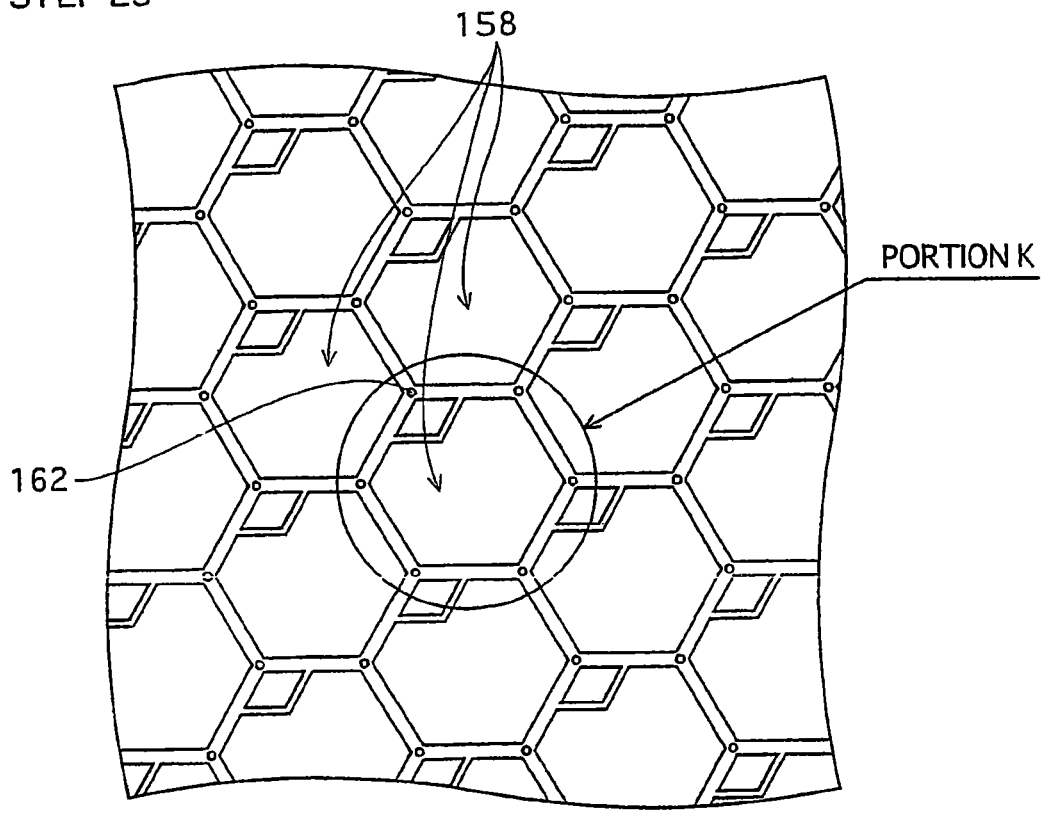
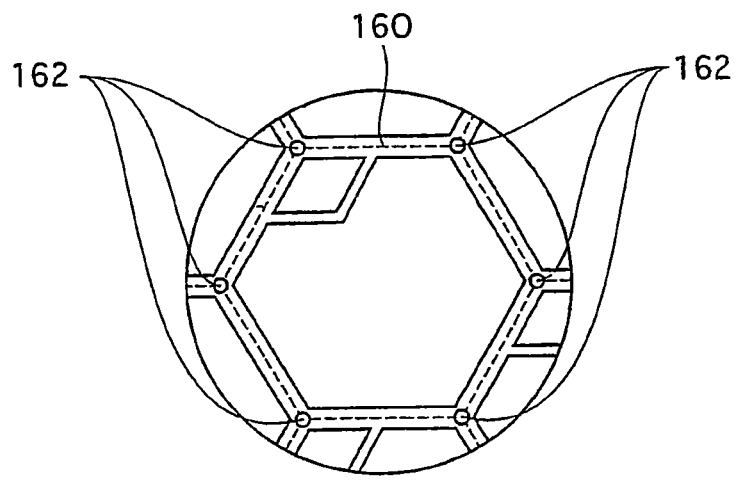
ENLARGED PORTION K

FIG.18
STEP F3
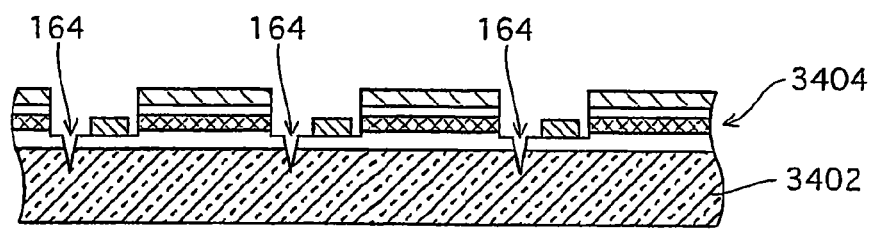
STEP G3
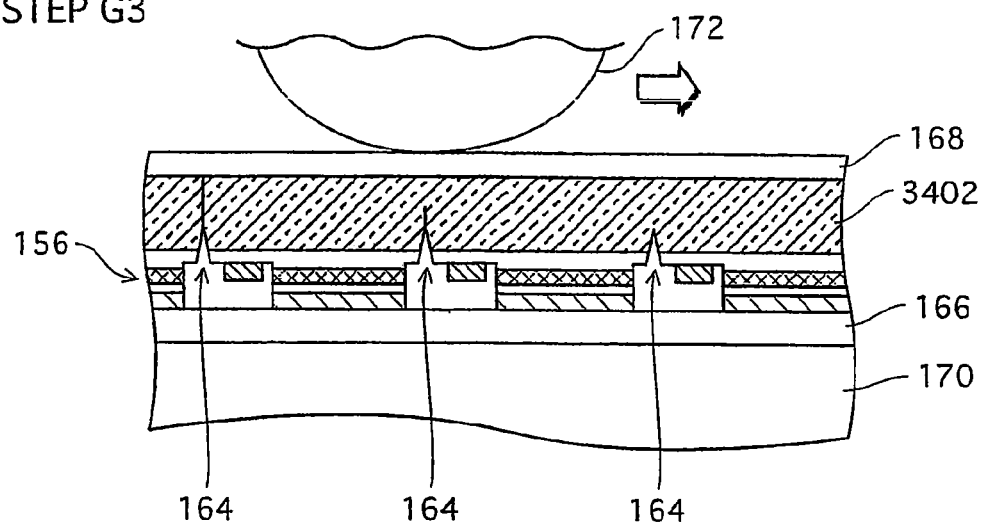
STEP H3
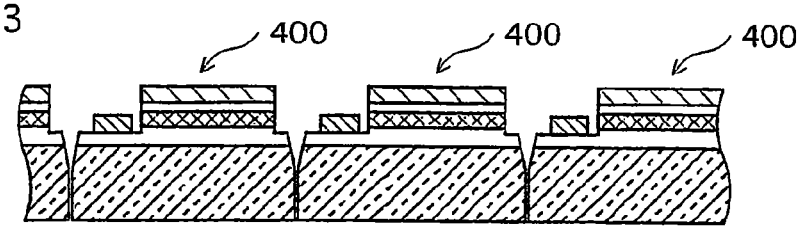

STEP G3

FIG.22
STEP A4
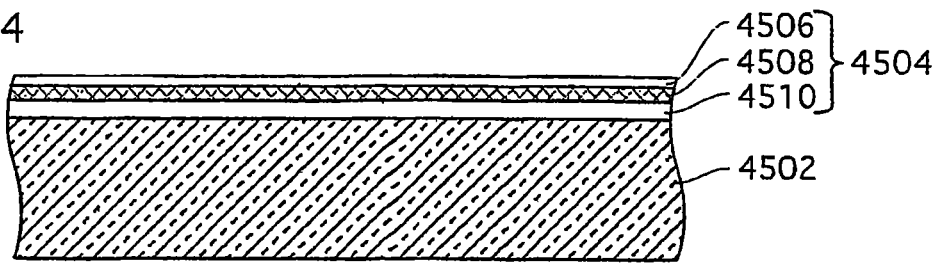
STEP B4
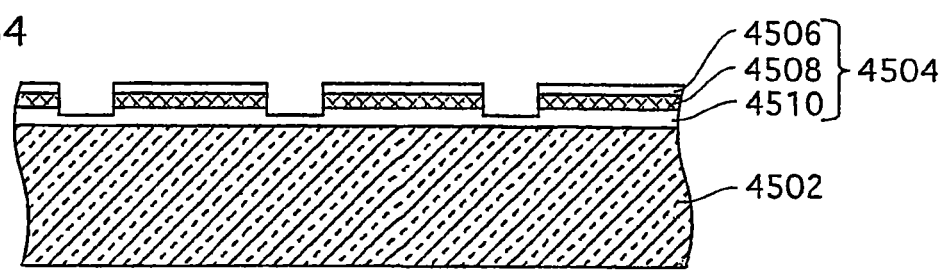
STEP C4
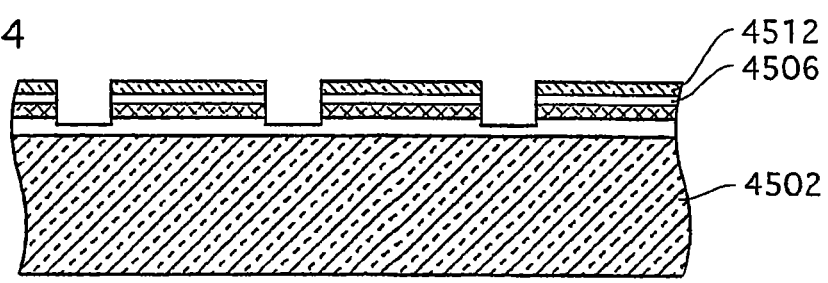
STEP D4
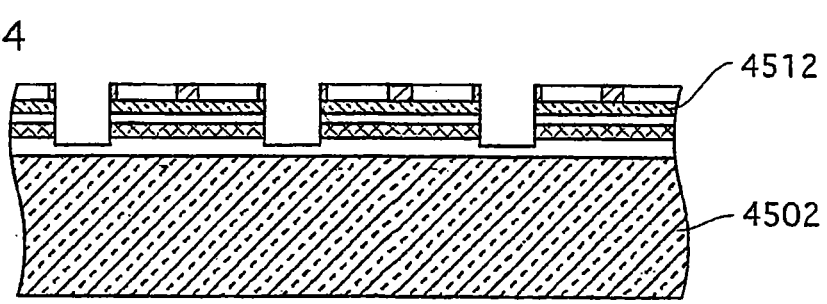
STEP E4
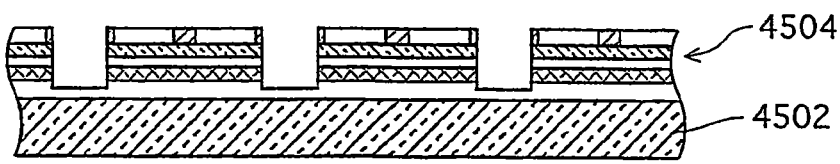

STEP B4

FIG. 24
STEP F4
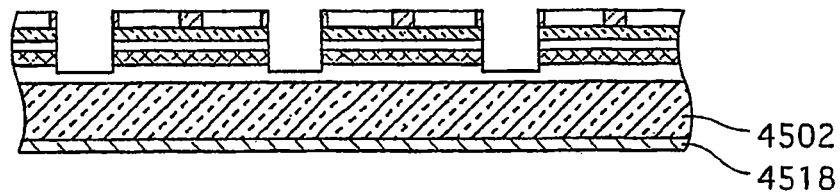
STEP H4
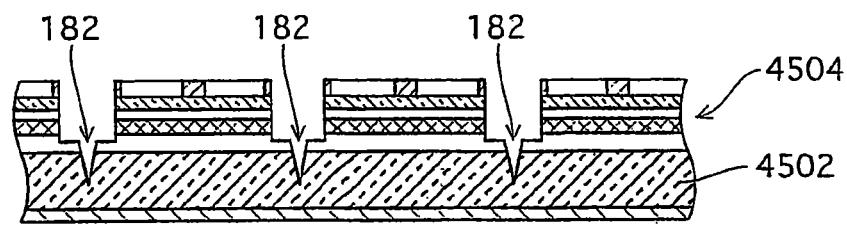
STEP J4
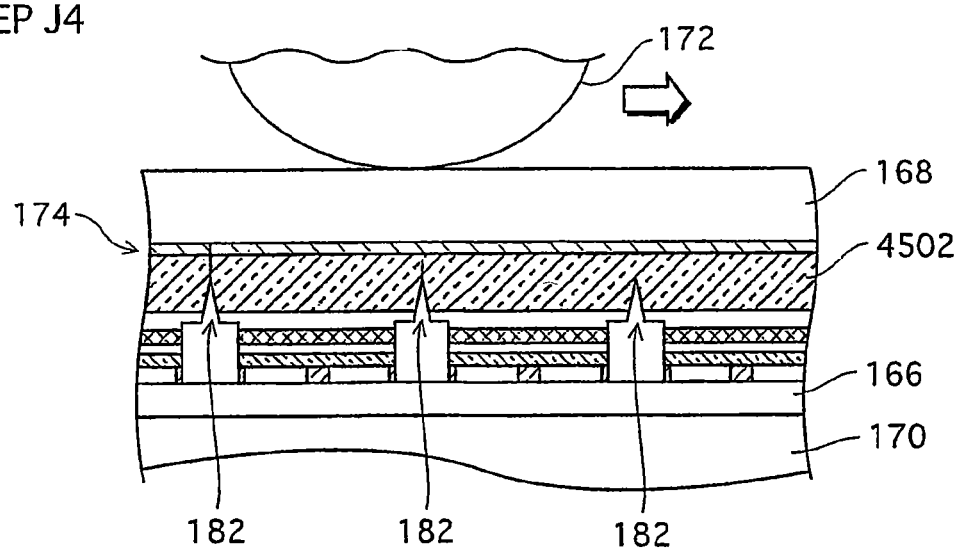
STEP K4
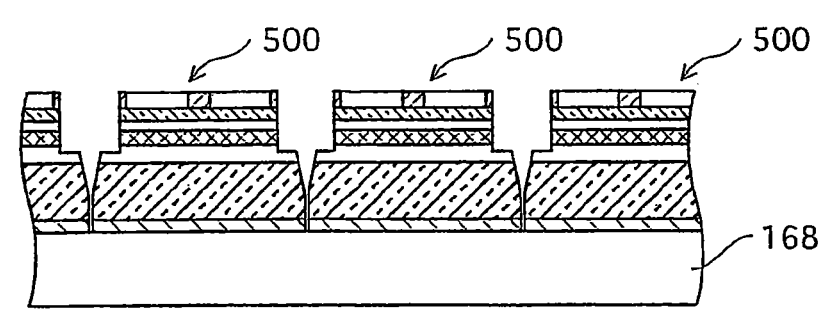

STEP G4

PORTION G

ENLARGED PORTION H

SEMICONDUCTOR LIGHT EMITTING DEVICE, ILLUMINATION MODULE, ILLUMINATION APPARATUS, METHOD FOR MANUFACTURING SEMICONDUCTOR LIGHT EMITTING DEVICE, AND METHOD FOR MANUFACTURING SEMICONDUCTOR LIGHT EMITTING ELEMENT

RELATED APPLICATIONS

This application is a divisional of U.S. application Ser. No. 11/720,258 filed on May 25, 2007, now U.S. Pat. No. 7,906,788 which is a §371 application of PCT/JP2005/024007 filed on Dec. 21, 2005, which claims priority from Japanese Application No. 2004-372319 filed on Dec. 22, 2004 and Japanese Application No. 2005-307575 filed on Oct. 21, 2005. A co-pending divisional application Ser. No. 12/695,076 was filed on Jan. 27, 2010 and issued as U.S. Pat. No. 8,022,420.

TECHNICAL FIELD

The present invention relates to a semiconductor light emitting device having a semiconductor light emitting element such as a light emitting diode (hereinafter, "LED") chip, and an illumination module and an illumination apparatus both using the semiconductor light emitting device. The present invention also relates to a manufacturing method for the semiconductor light emitting device and for the semiconductor light emitting element.

BACKGROUND ART

In comparison with incandescent and halogen lamps, LEDs have higher efficiency and longer lives. With the recent increase in the intensity of white LEDs, active studies have been made on application of the white LEDs to illumination purposes. Among various point light sources, LEDs are expected, owing to their property, to replace halogen lamps which are currently in wide use for spot lighting at shops, museums, and showrooms.

Unfortunately, however, a conventional white LED produces, on the irradiated surface, a beam spot distorted into a square shape. For application to the illumination purpose, the beam spot distortion needs to be corrected. A white LED produces a square-shaped beam spot because an LED chip (semiconductor light emitting element) constituting the white LED is rectangular and light is emitted mainly through a square-shaped surface thereof (see, for example, JP 2001-15817-A).

Ideally, it is desirable to produce LED chips having a cylindrical shape. Yet, the chances are extremely small in view of productivity. The reason lies in the dicing process, which is the final stage of LED chip manufacturing, to cut a wafer into separate LED chips with a diamond wheel. It is practically impossible to cut the wafer into cylindrical-shaped LED chips having a diameter on the order of hundreds microns. A rectangular LED chip may be ground into a cylindrical shape, which is also virtually impractical in view of the chip size.

In view of the above, an LED chip having the shape of a substantially regular hexagonal prism is suggested for ensuring both high productivity and a close-to-circle beam spot. LED chips having the shape of a substantially regular hexagonal prism can be manufactured with efficiency using the technique disclosed in JP 11-340507-A.

Here, with reference to FIG. 31, a description is given to the manufacturing method of LED chips having the shape of a substantially regular hexagonal prism, disclosed in JP 11-340507-A.

A single crystal substrate 300 has a hexagonal closest-packed lattice (hereinafter, simply "HCP") crystal structure, such as GaN or SiC, having the (0001) plane on main surfaces. As shown in FIG. 31A, the HCP single crystal substrate 300 can be cleaved along the [1-210], [2-1-10], and [11-20] orientations. One of the crystallographic orientations coincides with an orientation flat 302 of the single crystal substrate. For example, in the case where the [1-210] orientation is parallel to the orientation flat 302, the [2-1-10] and [11-20] orientations extend at 60° and 120° to the orientation flat 302, respectively.

In view of the above, after forming such components as electrodes and a semiconductor multilayer structure containing a light emission layer (none of the components are illustrated) on the single crystal substrate 300, cleavage guide grooves 304 are formed in the [1-210], [2-1-10], and [11-20] orientations indicated by doted lines in FIG. 31A. With the guide grooves 304, the single crystal substrate 300 is partitioned into hexagonal areas 306 each of which will be later formed into an LED chip. By cleaving along the guide grooves 304, the single crystal substrate is divided into separate LED chips.

According to the above method, LED chips having the shape of a hexagonal prism are manufactured with efficiency. In addition, by cleaving along the crystallographic planes, chipping and cracking of the semiconductor multilayer structure at the time of dicing are suppressed.

Although the technique disclosed in JP 11-340507-A ensures improved productively, there is a problem that the single crystal substrate is not fully used. More specifically, as shown in FIG. 31B, which is a partial enlarged view of FIG. 31A, portions of the semiconductor multilayer structure grown in substantially regular triangle areas 308, which are enclosed with the substantially regular hexagonal areas 306 to be later formed into LED chips, are wasted without being used.

In view of the above problem, the present invention aims to provide a semiconductor light emitting device which, as a whole, has the shape of a substantially regular hexagonal prism and yet allows the best possible use of the single crystal substrate with minimum wastage. The present invention also aims to provide an illumination module and an illumination apparatus both having the semiconductor light emitting device. The present invention also aims to provide a method for manufacturing the semiconductor light emitting device and a method for manufacturing a semiconductor light emitting element having the shape of a substantially regular hexagonal prism.

DISCLOSURE OF THE INVENTION

To achieve the above aim, a first aspect of the present invention provides a semiconductor light emitting device including a base substrate and three light emitting elements. Each light emitting element includes a semiconductor multilayer structure with a light emission layer, and has a rhombus shape with interior angles of approximately 60° and approximately 120° in plan view. The three light emitting elements are arranged on one main surface of the base substrate so as to together form a substantially regular hexagonal shape in plan view.

According to the structure stated above, the semiconductor light emitting device is provided with three light emitting elements each of which includes a semiconductor multilayer structure with a light emission layer and has a rhombus shape with interior angles of approximately 60° and approximately 120°. The three light emitting elements are arranged on one main surface of a base substrate so as to together form a substantially regular hexagonal shape in plan view. Consequently, the semiconductor light emitting device produces a beam spot closer to a circle than to a square. In addition, since each semiconductor multilayer structure has the rhombus shape, it is ensured to make the maximum use of a single crystal substrate in manufacturing such semiconductor multilayer structures.

In a second aspect, the present invention provides a semiconductor light emitting device including a base substrate and six light emitting elements. Each light emitting element includes a semiconductor multilayer structure with a light emission layer, and has a substantially regular triangular shape in plan view. The six light emitting elements are arranged on one main surface of the base substrate so as to together form a substantially regular hexagonal shape in plan view.

According to the structure stated above, a semiconductor light emitting device is provided with six light emitting elements each of which includes a semiconductor multilayer structure with a light emission layer and has a substantially regular triangular shape in plan view. The six light emitting elements are arranged on one main surface of a base substrate so as to together form a substantially regular hexagonal shape in plan view. Consequently, the semiconductor light emitting device produces a beam spot closer to a circle than to a square. In addition, since each semiconductor multilayer structure has a substantially regular triangular shape, it is ensured to make the best possible use of a single crystal substrate in manufacturing such semiconductor multilayer structures.

In a third aspect, the present invention provides an illumination module including a mounting substrate and the semiconductor light emitting device that is provided in the first aspect of the present invention and mounted on the mounting substrate. In a fourth aspect, the present invention provides an illumination module including a mounting substrate and the semiconductor light emitting device that is provided in the second aspect of the present invention and mounted on the mounting substrate.

In a fifth aspect, the present invention provides an illumination apparatus including, as a light source, the illumination module that is provided in the third aspect of the present invention. In a sixth aspect, the present invention provides an illumination apparatus including, as a light source, the illumination module that is provided in the fourth aspect of the present invention.

In a seventh aspect, the present invention provides a manufacturing method for a semiconductor light emitting device. The method includes: a growing step of growing a semiconductor multilayer structure that includes a light emission layer, on one main surface of a substrate of which crystal structure is a hexagonal closest-packed single crystal structure having a (0001) plane; a partitioning step of forming guide grooves in [1-210], [2-1-10], and [11-20] orientations in at least one of two main surfaces of the substrate so as to partition said at least one main surface, except along a periphery thereof, into a plurality of areas of a uniform shape; a cleaving step of cleaving the substrate into a plurality of separate chips along the guide grooves; and a combining step of arranging two or more of the chips so as to together form a substantially regular hexagonal shape in plan view.

According to the above method, guide grooves are formed in [1-210], [2-1-10], and [11-20] orientations in at least one of two main surfaces of a single crystal substrate of which crystal structure is a hexagonal closest-packed single crystal structure having a (0001) plane. With the guide grooves, said at least one main surface, except along a periphery thereof, is cleaved into a plurality of areas of a uniform shape. Then, the substrate is cleaved into a plurality of separate chips along the guide grooves. To manufacture a semiconductor light emitting device, two or more of the plurality of chips obtained by the cleaving are arranged so as to together form a substantially regular hexagonal shape in plan view. Consequently, the best possible use of the single crystal substrate is ensured. In addition, since the chips are arranged to form a substantially regular hexagonal shape in plan view, the resulting semiconductor light emitting device produces a beam spot closer to a circle than to a square.

In an eighth aspect, the present invention provides a manufacturing method for a semiconductor light emitting device. The method includes: a growing step of growing a semiconductor multilayer structure that includes a light emission layer, on one main surface of a substrate of which crystal structure is a hexagonal closest-packed single crystal structure having a (0001) plane; a partitioning step of forming guide grooves in [1-210], [2-1-10], and [11-20] orientations in at least one of two main surfaces of the substrate so as to partition said at least one main surface, except along a periphery thereof, into a honeycomb pattern with a plurality of substantially regular hexagonal areas; and a cleaving step of cleaving the substrate into a plurality of separate chips along the guide grooves.

According to the above method, guide grooves are formed in [1-210], [2-1-10], and [11-20] orientations in at least one of two main surfaces of a single crystal substrate of which crystal structure is a hexagonal closest-packed single crystal structure having a (0001) plane. With the guide grooves, said at least one main surface, except along a periphery thereof, is partitioned into a honeycomb pattern with a plurality of substantially regular hexagonal areas. Then, the substrate is cleaved into a plurality of separate chips along the guide grooves, whereby semiconductor light emitting elements are obtained. By virtue of the partitioning into a honeycomb pattern, the single crystal substrate is economically used with minimum wastage. In addition, since each semiconductor light emitting element has a substantially regular hexagonal shape by itself, the semiconductor light emitting element produces a beam spot closer to a circle than to a square.

BRIEF DESCRIPTION OF THE DRAWINGS

FIG. 1 are views showing a semiconductor light emitting device consistent with an embodiment 1 of the present invention;

FIG. 3 is a view showing manufacturing steps of the semiconductor light emitting device of the embodiment 1;

FIG. 4 is a view showing manufacturing steps of the semiconductor light emitting device of the embodiment 1;

FIG. 6 is a view showing manufacturing steps of the semiconductor light emitting device of the embodiment 1;

FIG. 7 is a view showing manufacturing steps of the semiconductor light emitting device of the embodiment 1;

FIG. 10 is a view showing manufacturing steps of the semiconductor light emitting device of the embodiment 2;

FIG. 12 is a view showing manufacturing steps of the semiconductor light emitting device of the embodiment 2;

FIG. 13 is a view showing manufacturing steps of the semiconductor light emitting device of the embodiment 2;

FIG. 15 is a view showing steps of the manufacturing method of the embodiment 3;

FIG. 17 is a view showing a step of the manufacturing method of the embodiment 3;

FIG. 18 is a view showing steps of the manufacturing method of the embodiment 3;

FIG. 22 is a view showing steps of the manufacturing method of the embodiment 4;

FIG. 24 is a view showing steps of the manufacturing method of the embodiment 4;

BEST MODE FOR CARRYING OUT THE INVENTION

Hereinafter, a description is given to embodiments of the present invention, with reference to the accompanying drawings.

Embodiment 1

FIG. 1A is an oblique view and FIG. 1B is a plan view of a semiconductor light emitting device 10 consistent with an embodiment 1 of the present invention. FIG. 1C is a sectional view of the semiconductor light emitting device 10 substantially taken along the line A-A of FIG. 1B. Note that the components shown in the figures, including FIGS. 1A, 1B, and 1C, are not illustrated on the same scale.

The semiconductor light emitting device 10 includes: a base substrate 12 having a substantially regular hexagonal shape; three LED chips 14A, 14B, and 14C, shown as exemplary semiconductor light emitting elements, mounted on the base substrate 12; and a phosphor 16 covering all the LED chips 14A-14C (upper and lateral surfaces thereof).

Figure 2A:
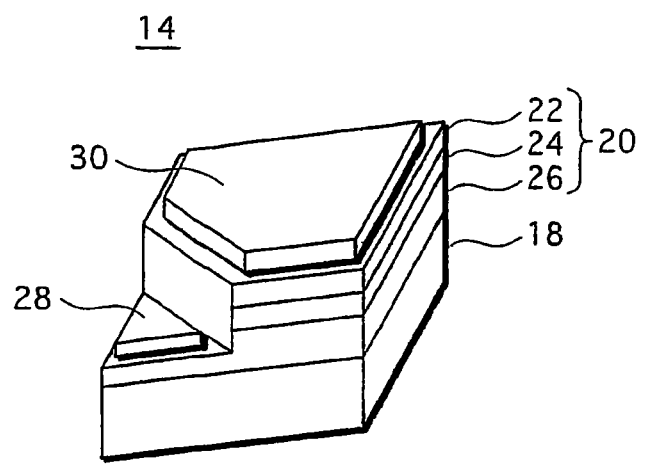
FIG. 2 are views showing an LED chip constituting the semiconductor light emitting device of the embodiment 1.

The three LED chips 14A-14C are all identical in structure. Thus, when it is not necessary to distinguish one from another, the reference numeral 14 is used without accompanying the letters A-C. FIG. 2A is an oblique view and FIG. 2B is a plan view of an LED chip 14.

Figure 2B:
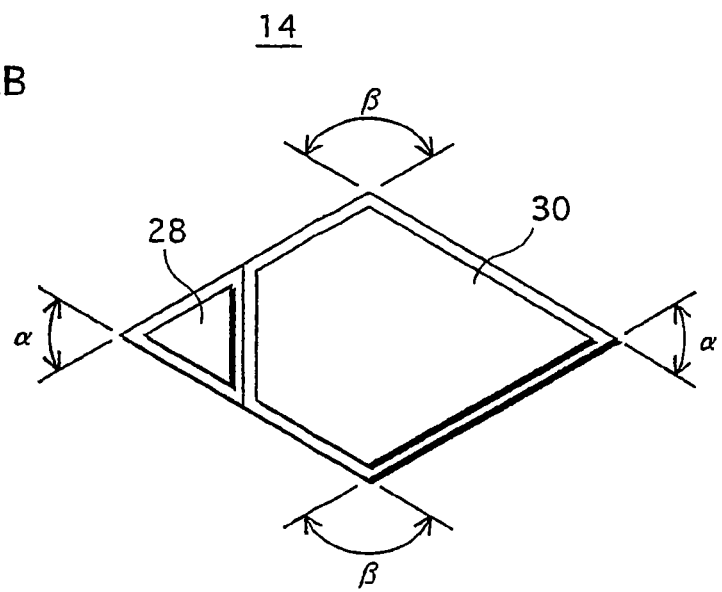

As shown in FIG. 2B, the LED chip 14 is in a substantially rhombus shape with interior angles $\square$=60° and $\square$=120°. The reason for choosing such a rhombus shape will be described later.

The LED chip 14 includes a single crystal substrate 18 having the HCP crystal structure and a semiconductor multilayer structure (multilayer epitaxial structure) 20. The semiconductor multilayer structure 20 is composed of a first conductive layer 22 of a first conductive type made of p-GaN layer, a light emission layer 24 made of an InGaN/GaN multiple quantum well (hereinafter "MQW") layer, a second conductive layer 26 of a second conductive type made of an n-GaN layer in the stated order from the top (i.e. from the side further away from the single crystal substrate 18). The semiconductor multilayer structure 20 constitutes a diode. Note that the single crystal substrate 18 is made of an n-GaN and the semiconductor multilayer structure 20 was epitaxially grown thereon.

When seen the LED chip 14 from the above, a corner portion of the substantially rhombus semiconductor multilayer structure 20 is removed in the shape of a substantially regular triangle. In the thickness direction of the layers, the removed portion extends from the first conductive layer 22 to some midpoint in the second conductive layer 26. That is, as a result of the removal, an area of the second conductive layer 26 is exposed in the shape of a regular triangle. On the triangle area of the second conductive layer 26, an n-electrode is formed as a second electrode 28. On the upper surface of the first conductive layer 22, a p-electrode is formed as a first electrode 30. The second electrode 28 is made of a stack of Ti/Au films, whereas the first electrode 30 is made of a stack of Rh/Pt/Au films.

Referring back to FIG. 1, the base substrate 12 includes an insulating substrate 32 made of AlN (aluminum nitride). On the upper surface of the insulating substrate 32, a first conductive pattern 34, a second conductive pattern 36, a third conductive pattern 38, and a fourth conductive pattern 40 are formed. Each of the first to fourth conductive patterns 36-40 is made of a stack of Ti/Pt/Al films.

On the undersurface of the insulating substrate 32, a first power supply terminal 42 is formed for anode and a second power supply terminal 44 is formed for cathode. Each of the power supply terminals 42 and 44 is made of a stack of Ni/Au films. The first power supply terminal 42 is electrically connected to the first conductive pattern 34 via plated-through-holes 46 and 48, whereas the second power supply terminal 44 is electrically connected to the fourth conductive pattern 40 via plated-through-holes 50 and 54.

On the base substrate 12 having the above structure, the LED chips 14A-14C are flip-chip mounted. The first electrode 30A of the LED chip 14A is joined to part of the first conductive pattern 34 via metal bumps 56. The first electrode 30B of the LED chip 14B is joined to part of the second conductive pattern 36 via metal bumps 58. The first electrode 30C of the LED chip 14C is joined to part of the third conductive pattern 38 via metal bumps 60. Similarly, the second electrode 28A of the LED chip 14A is joined to part of the second conductive pattern 36 via a metal bump 62. The second electrode 28B of the LED chip 14B is joined to part of the third conductive pattern 38 via a metal bump 64. The second electrode 28C of the LED chip 14C is joined to part of the fourth conductive pattern 40 via a metal bump 66. As is clear from the above-described connections, the LED chips 14A-14C are connected in series as shown in FIG. 1D via the second and third conductive patterns 36 and 38. Normally, the drive voltage of a diode made of a GaN semiconductor is 3-4 V and thus the drive voltage of an LED array of three serially connected diodes is on the order of 12 V. Generally, a 12 V power supply is used for driving electronic appliances. That is to say, the semiconductor light emitting device 10 incorporated into an electronic appliance is usable without requiring an additional power source or a dedicated power circuit. It should be appreciated, however, that the LED chips 14A-14C may be connected in parallel or provided with their own terminals to be electrically independent.

The LED chips 14A-14C each of which is in a substantially rhombus shape are arranged on the base substrate 12, so as to face one another at a vertex forming the larger interior angle in plan view. That is, the LED chips 14A-14C arranged on the base substrate 12 together form a substantially regular hexagonal shape in plan view.

The phosphor 16 is shaped into a substantially regular hexagonal prism conforming to the overall shape formed by the LED chips 14A-14C altogether. Strictly speaking, the phosphor 16 is substantially in the shape of a frustum of a regular hexagonal pyramid having tapered lateral surfaces, for a later-described manufacturing reason. Yet, the taper angle is extremely small, so that the phosphor 16 is regarded to be substantially in the shape of a regular hexagonal prism. As shown in FIG. 1B, the central axis of the hexagonal prism of the phosphor 16 is made to substantially coincide with the central axis of the hexagonal shape formed by the LED chips 14A-14C altogether. The phosphor 16 is made of powder of phosphor materials and impalpable particles of $SiO_2$ dispersed in a transparent resin, such as silicone. The phosphor materials include yellowish green phosphor powder such as $(Ba,Sr)_2SiO_4:Eu^{2+}$ or $Y_3(Al,Ga)_5O_{12}:Ce^{3+}$, and red phosphor powder such as $Sr_2Si_5N_8:Eu^{2+}$ or $(Ca,Sr)S:Eu^{2+}$.

The semiconductor light emitting device 10 having the above structure is mounted on a printed wiring board or the like to be ready for use. For mounting, the first and second power supply terminal 42 and 44 are soldered onto mounting pads of the printed wiring board. Here, by virtue of the substantially regular hexagonal shape of the base substrate 12, a plurality of semiconductor light emitting devices 10 may be arranged in a honeycomb pattern on the printed wiring board or the like at a high packaging density.

On application of an electric current via the first and second power supply terminals 42 and 44, each light emission layer 24 emits blue light at a wavelength of 460 nm. Part of the blue light emitted from the light emission layer 24 travels toward the first conductive layer 22 and is reflected toward the second conductive layer 26 by the first electrode 30, which is made of a material having high reflectivity. Part of the blue light emitted from the light emission layer 24 travels directly toward the second conductive layer 26. After passing through the second conductive layer 26 and the single crystal substrate 18, the blue light is partly absorbed by the phosphor 16 to be converted into yellowish green light and red light. A mixture of the blue light, the yellowish green light, and the red light produces white light, and the white light finally exits the phosphor 16 mainly from the upper surface thereof. Similarly, blue light emitted from each light emission layer 24 in a lateral direction (blue light emitted from the lateral surfaces of each semiconductor multilayer structure 20) is partly converted by the phosphor 16 into yellowish green light and red light. A mixture of the blue light, the yellowish green light, and the red light produces white light, and the white light exits the phosphor 16 mainly from the lateral surfaces. Here, since the white light is emitted from the LED chips 14A-14C arranged to form a substantially regular hexagonal shape in plan view, the beam spot is more circular than that produced by a conventional square LED chip.

Next, a description is given to a manufacturing method of the semiconductor light emitting device 10 consistent with the embodiment 1, with reference to FIGS. 3-7. In FIGS. 3-7, the materials of the components of the semiconductor light emitting device 10 are denoted by reference numerals in the one thousands and its last two digits correspond to the reference numerals denoting the corresponding components.

First, as shown in FIG. 3, a semiconductor multilayer structure 1020 is formed by epitaxially growing the following layers in the stated order over the (0001) plane of an N-GaN single crystal substrate 1018 by MOCVD (Metal Organic Chemical Vapor Deposition) (Step A1). That is, an n-GaN layer 1026 which will later constitute the second conductive layer 26 (FIG. 1), an InGaN/GaN MQW light emission layer 1024 which will later constitute the light emission layer 24 (FIG. 1), a p-GaN layer 1022 which will later constitute the first conductive layer 22 (FIG. 1) are sequentially deposited in the stated order. The single crystal substrate may alternatively be a sapphire substrate or a SiC substrate.

In order to create the area (the regular triangle area) for forming the second electrode 28 (FIG. 1), part of the n-GaN layer 1026, InGaN/GaN MQW light emission layer 1024, and p-GaN layer 1022 is removed by, for example, dry etching (Step B1).

Next, a stack 1030 of Rh/Pt/Au films is formed on the upper surface of the p-GaN layer 1022 by, for example, electron beam evaporation (Step C1). The Rh/Pt/Au film stack 1030 will later constitute the first electrode 30 (FIG. 1).

On the regular triangle area, a stack 1028 of Ti/Au films which will later constitute the second electrode 28 (FIG. 1) is formed (Step D1).

Referring now to FIG. 4, the surface of the single crystal substrate 1018 facing away from the semiconductor multilayer structure 1020 is ground by, for example, mechanical grinding, until the thickness reaches 200 μm or so (Step E1).

Cleavage guide grooves 68 are formed in the ground surface of the single crystal substrate 1018 by, for example, dry etching (Step F1). The steps F1 and G1 will be described later in more detail.

Along the guide grooves 68, the single crystal substrate 1018 is cleaved into separate pieces, whereby LED chips 14 are obtained (Step G1).

In the above steps F1 and G1, the single crystal substrate is split along the crystallographic planes into LED chips each having a rhombus shape. Since this process of cleaving is disclosed in JP 11-340507-A, a description is given only briefly with reference to FIG. 5.

Figure 5A:
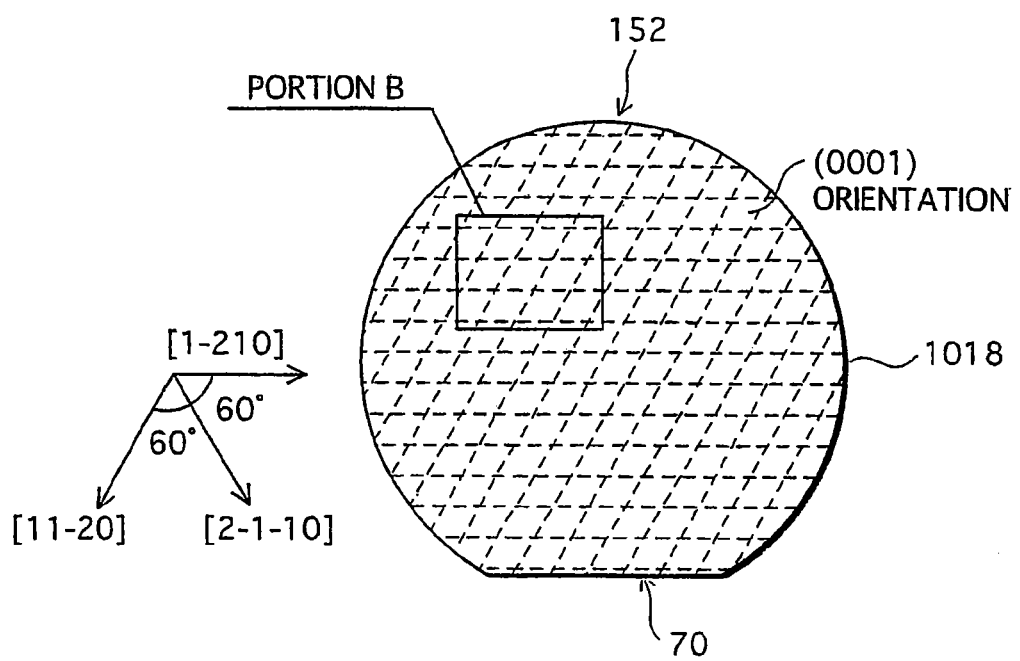
FIG. 5 are views showing a manufacturing step of the semiconductor light emitting device of the embodiment 1.

As shown in FIG. 5A, the HCP single crystal substrate 1018, such as a GaN or SiC, having the (0001) plane on main surfaces can be cleaved in the [1-210], [2-1-10], and [11-20] orientations. One of the crystallographic orientations coincides with an orientation flat 70 of the single crystal substrate 1018. For example, in the case where the [1-210] orientation is parallel to the orientation flat 70, the [2-1-10] orientation extends at 60° to the orientation flat 70, and the [11-20] orientation extends at 120° to the orientation flat 70.

Figure 5B:
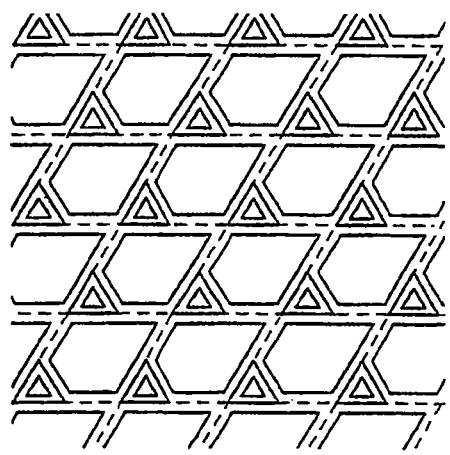
Figure 31A:
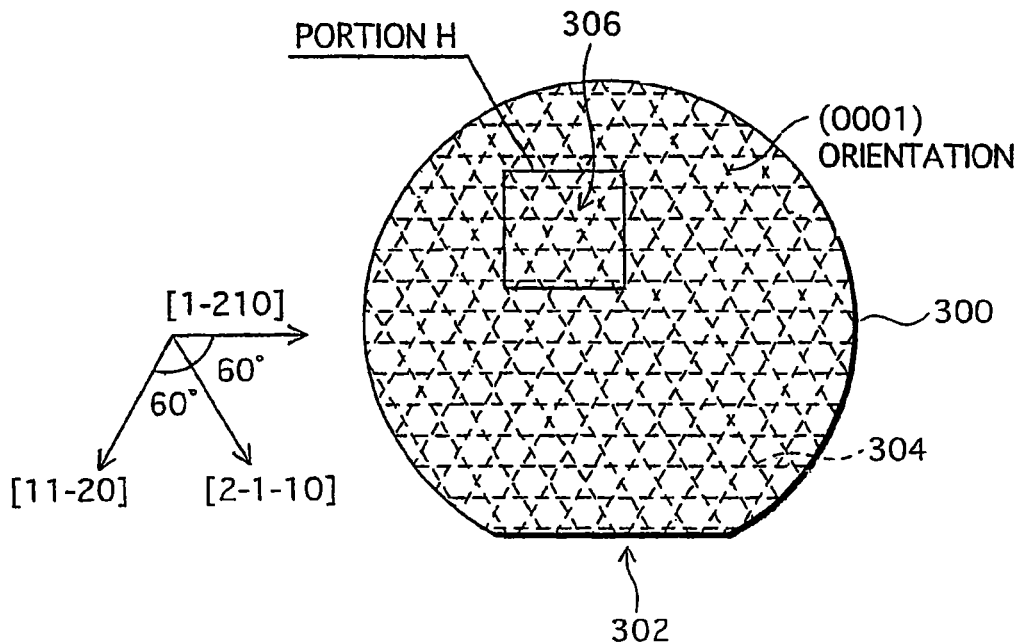
FIG. 31 are views showing a conventional manufacturing method for a semiconductor light emitting device having a regular hexagonal shape.
Figure 31B:
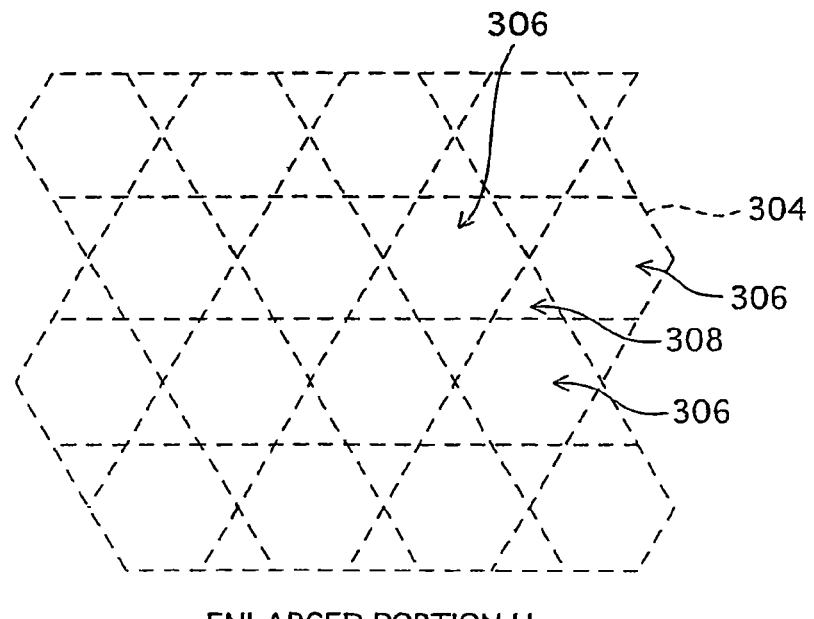

In view of the above, the guide grooves 68 (FIG. 4, Step F1) are formed in the [1-210], [2-1-10], and [11-20] orientations indicated by doted lines in FIGS. 5A and 5B. With the guide grooves 68, the single crystal substrate 1018 is partitioned into rhombus areas. By cleaving along the guide grooves 68, the single crystal substrate 1018 is divided into separate LED chips. Cleavage along the crystallographic planes is advantageous in that chipping and cracking of the semiconductor multilayer structure at the time of dicing are suppressed. Occurrences of chipping and cracking adversely influence the rhombus shape of semiconductor multilayer structure. In addition, the leak current tends to increase, which adversely affect the reliability. There is another advantage that the single crystal substrate 1018 (semiconductor multilayer structure) is fully used without waste, except along the outer periphery where no more rhombus areas can be formed. That is, the better use of the single crystal substrate is ensured in comparison with the conventional example shown in FIG. 31.

Now, with reference to FIGS. 6 and 7, a description is given to the steps of manufacturing the base substrate 12 (FIG. 1) and of mounting the LED chips 14 (FIG. 1) onto the base substrate 12. Note that FIGS. 6 and 7 showing the manufacturing steps are sectional views taken along the line C-C passing through the semiconductor light emitting device 10 shown in FIG. 1B.

First, as shown in FIG. 6, for forming plated-through-holes 46, 48, 50, 54 (FIG. 1), through holes are formed through a ceramic sheet 1032 which is made of AlN and not yet sintered. The through-holes are then filled with a metal paste (tungsten (W) paste, for example). The entire substrate is then sintered to obtain a 300 µm thick insulation substrate 1032 having plated through-holes 1046, 1048, 1050, and 1054. (Step H1)

Then, the undersurface of the insulating substrate 1032 is ground by, for example, mechanical grinding, until the thickness reaches 200 µm or so (Step J1).

In predetermined areas of the upper surface of the insulating substrate 1032, stacks of Ti/Pt/Au films are formed by, for example, sputtering to provide the first to fourth conductive patterns 34-40 (FIG. 1) (Step K1).

In predetermined areas of the undersurface of the insulating substrate 1032, stacks of Ni/Au films are formed by, for example, plating to provide the first and second power supply terminals 42 and 44 (FIG. 1) (Step L1).

At predetermined locations on the first to fourth conductive patterns 34-40, metal bumps 1058, 1060, and 1066 are formed with gold (Au) (Step M1).

The LED chips 14A-14C are flip-chip mounted appropriately on the first to fourth conductive patterns 34-40 (Step N1).

A silicone resin containing phosphor particles and thixotropy such as aerosil is applied by, for example, screen printing to cover all the LED chips 14A-14C. Here, the silicon resin is shaped into a substantially regular hexagonal prism. The silicon resin is then thermally cured to form the phosphor 16. (Step Q1)

The insulating substrate 1032 is cut into separate pieces with a dicing blade DB (Step R1). Each piece constitutes a finished semiconductor light emitting device 10. Note that a laser cutting may be employed instead of the dicing blade.

According to the embodiment 1, the LED chips are manufactured using cleavage along the crystallographic planes, to each have a rhombus shape in plan view. For implementing such cleavage, the semiconductor multilayer structures each including a light emission layer are grown on an HCP single crystal substrate. The HCP single crystal substrate is divided into separate LED chips using the dicing blade DB, which is used in the step R1 shown in FIG. 7, or a laser beam, so that the dicing may be carried out along lines that may or may not coincide with the crystallographic planes. In the case where the dicing is carried out along the lines which do not coincide with the crystallographic planes, the semiconductor multilayer structures may be grown on a substrate, such as an Si substrate, not having the HCP crystal structure. By dividing the substrate into pieces in a pattern shown in 5A, separate LED chips each having a rhombus shape can be obtained.

Note in the case of dicing with a dicing blade, there is a risk of chipping and cracking of LED chips, and the risk increases when the wafer (i.e. the substrate) is hard. In the case of dicing with a laser beam, it is preferable to carry out the dicing with a lowest possible power in order to avoid any damage to the light emission layers. In view of the above, a thinner wafer is more preferable.

Embodiment 2

Figure 8A:
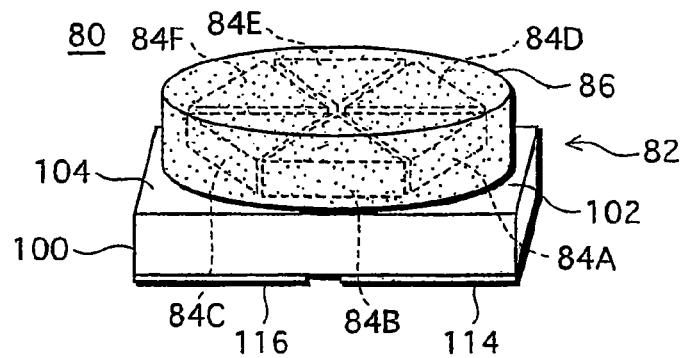
FIG. 8 are views showing a semiconductor light emitting device consistent with an embodiment 2 of the present invention.
Figure 8B:
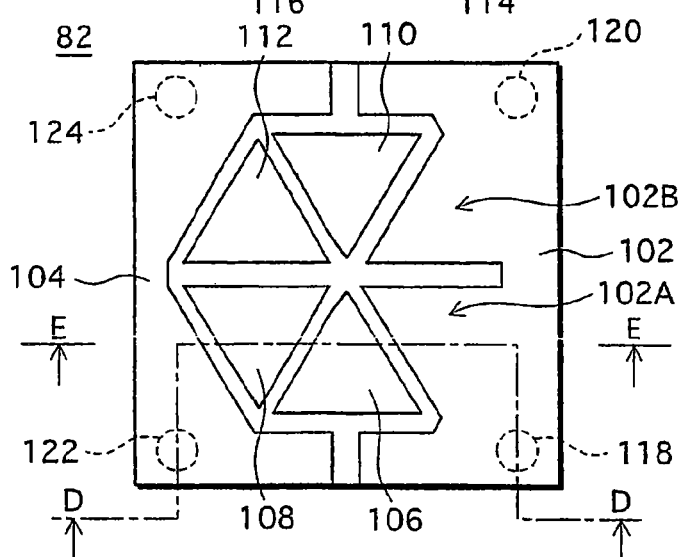
Figure 8C:
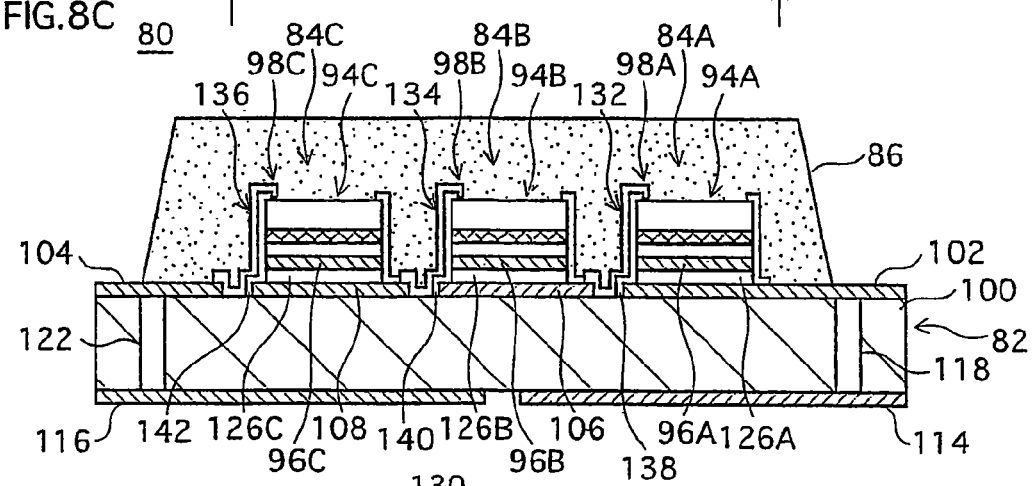

FIG. 8A is an oblique view of a semiconductor light emitting device 80. FIG. 8B is a plan view of a base substrate 82, which will be described later. FIG. 8C is a sectional view of the semiconductor light emitting device 80 taken along the line D-D of FIG. 8B.

The semiconductor light emitting device 80 is composed of the base substrate 82 having a substantially square shape, six LEDs 84A, 84B, 84C, 84D, 84E, and 84F, as exemplary semiconductor light emitting elements, mounted on the base substrate 82, and a phosphor 86 covering all the LEDs 84A-84F (upper and lateral surfaces).

Figure 9A:
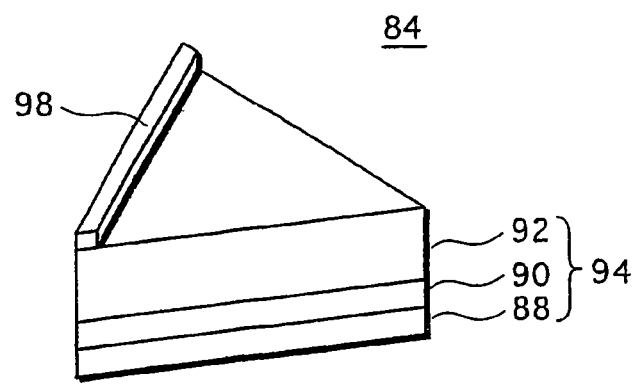
FIG. 9 are views showing an LED chip constituting the semiconductor light emitting device of the embodiment 2.
Figure 9B:
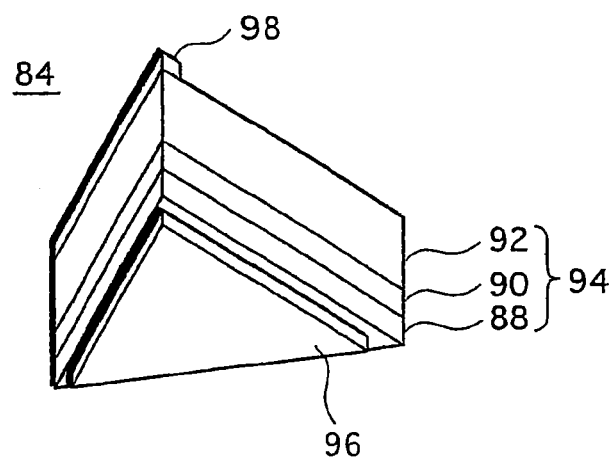

The six LED chips 84A-84F are all identical in structure. Thus, when it is not necessary to distinguish one from another, the reference numeral 84 is used without accompanying the letters A-F. FIGS. 9A and 9B are views of an LED chip 84 seen obliquely from the above and the bottom, respectively.

As shown in FIGS. 9A and 9B, the LED chip 84 is in the shape of a substantially regular triangular prism (i.e. a substantially regular triangle in plan view). The reason for choosing such a triangular shape will be described later.

The LED chip 84 has a semiconductor multilayer structure (multilayer epitaxial structure) 94 composed of a first conductive layer 88 of a first conductive type made of a p-AlGaN layer, a light emission layer 90 made of an AlGaN/InGaN MQW layer, a second conductive layer 92 of a second conductive type made of an n-AlGaN layer deposited in the stated order. The semiconductor multilayer structure 94 constitutes a diode. As will be later described, the semiconductor multilayer structure 94 was epitaxially grown on a single crystal substrate 144 (FIG. 10) not on the base substrate 82.

On the undersurface of the first conductive layer 88, a p-electrode is formed as a first electrode 96. Along one side of the upper surface of the second conductive layer 92, an n-electrode is formed as a second electrode 98. The first electrode 96 is made of a stack of Rh/Pt/Au films, whereas the second electrode 98 is made of a stack of Ti/Au films.

Referring back to FIG. 8, the base substrate 82 includes an insulating substrate 100 made of AlN. On the upper surface of the insulating substrate 100, a first conductive pattern 102, a second conductive pattern 104, a third conductive pattern 106, a fourth conductive pattern 108, a fifth conductive pattern 110, and a sixth conductive pattern 112 are formed. The first to sixth conductive patterns 102-112 are each made of a stack of Ti/Pt/Al films.

On the undersurface of the insulating substrate 100, a first power supply terminal 114 is formed for anode and a second power supply terminal 116 is formed for cathode. Each of the power supply terminals 114 and 116 is made of a stack of Ni/Au films. The first power supply terminal 114 is electrically connected to the first conductive pattern 102 via plated-through-holes 118 and 120, whereas the second power supply terminal 116 is electrically connected to the second conductive pattern 104 via plated-through-holes 122 and 124.

The LED chips 84A-84F are mounted at predetermined locations of the first to sixth conductive patterns 102-112 formed on the base substrate 82 having the above structure. Each LED 84 is so mounted that the first electrode 96 (FIG. 9B) faces downward and is appropriately joined to predetermined areas of the first to sixth conductive patterns 102-112 via bonding layers (which will be described later) made of AuSn. More specifically, the LED 84A is joined to an area 102A shaped like a triangular peninsula via a bonding layer 126A. The LED 84B is joined to the third conductive pattern 106 via a bonding layer 126B. The LED 84C is joined to the fourth conductive pattern 108 via a bonding layer 126C. Similarly, the LED 84D is joined to an area 102B of the first conductive pattern 102 via a bonding layer (not illustrated). The LED 84E and the LED 84F are joined to the fifth and sixth conductive patterns 110 and 112, respectively, via bonding layers (not illustrated). Needless to say, the LEDs 84A-84F are joined in the state where the LEDs 84A-84F are positioned to coincide with the triangles defined by the conductive patterns.

Among the LEDs 84A-84F joined in the above manner, the LEDs 84A, 84B, and 84C are electrically connected in series. Similarly, the LEDs 84D, 84E, and 84F are electrically connected in series. (Hereinafter, the serially connected LEDs 84A-84C are collectively referred to as a "first LED array 128", whereas the serially connected LEDs 84D-84F are collectively referred to as a "second LED array 130").

The first and second LED arrays 128 and 130 are identical in the manner of how the respective LEDs are connected. Thus, with reference to FIG. 8C, a description is given only to how the LEDs of the first LED array 128 are connected.

The second electrode 98A of the LED 84A is electrically connected to the third conductive pattern 106 via bridge wiring 132. Consequently, the second electrode 98A of the LED 84A and the first electrode 96B of the LED 84B are electrically connected. Note that the second electrode 98A and the bridge wiring 132 are integrally formed as described later.

Similarly, the second electrode 98B of the LED 84B is electrically connected to the fourth conductive pattern 108 via bridge wiring 134. Consequently, the second electrode 98B of the LED 84B and the first electrode 96C of the LED 84C are electrically connected. Note that the second electrode 98B and the bridge wiring 134 are also integrally formed as described later.

That is, the LEDs 84A, 84B, and 84C are connected in series via the bridge wiring 132 and 134 and the like.

In addition, the second electrode 98C of the LED 84C is electrically connected to the second conductive pattern 104 via bridge wiring 136. Note that the second electrode 98C and the bridge wiring 136 are also integrally formed as described later. In addition, the first electrode 96A of the LED 84A is connected to the first conductive layer 102, as described above.

Note that the bridge wiring 132, 134, and 136 are electrically insulated from the semiconductor multilayer structures 94A, 94B, and 94C by insulating films 138, 140, and 142 made of silicone nitride.

Figure 8D:
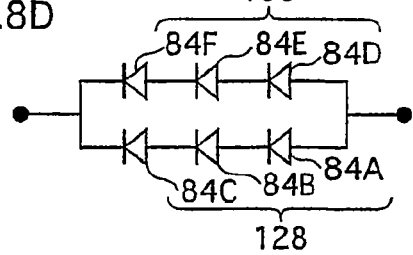

The same description applies to the connection of the second LED array 130. That is, the first and second LED arrays 128 and 130 are connected in parallel as shown in FIG. 8D.

By connecting three LEDs in series as above, the same advantage as that achieved by the embodiment 1 is achieved regarding required power source. It should be noted, however, that the LEDs 84A-84F may be connected in a 2 series×3 parallel arrangement (i.e. the LEDs are serially connected in pairs and the serially connected LED pairs are connected in parallel). Alternatively, the LEDs 84A-84F may be provided with their own terminals to be electrically independent.

In addition, since the substantially regular triangle LEDs 84A-84F are so arranged on the base substrate 82 that one vertex of every LED 84 is directed substantially to the same point in plan view. With this arrangement, the LEDs 84A-84F on the base substrate 82 collectively form a substantially regular hexagon in plan view.

The phosphor 86 has a substantially cylindrical outer shape. Strictly speaking, the phosphor 86 is substantially in the shape of a frustum of a cone having a tapered lateral surface, for a later-described manufacturing reason. Yet, the taper angle is extremely small, so that the phosphor 86 is regarded to be substantially in a cylindrical shape. The central axis of the cylindrical shape is made to substantially coincide with the central axis of the hexagonal shape formed altogether by the LEDs 84A-84D. The phosphor 86 is made of a transparent resin, such as silicone, containing dispersed powder of phosphor materials of at least one of each of four colors (blue, green, yellow, and red) as well as impalpable particles of metal oxide, such as $SiO_2$. Examples of blue phosphor materials include $(Ba,Sr)MgAl_{10}O_{17}:Eu^{2+}$, and $(Ba,Sr,Ca,Mg)_{10}(PO_4)_6Cl_2:Eu^{2+}$. Examples of green phosphor materials include $BaMgAl_{10}O_{17}:Eu^{2+}$, $Mn^{2+}$, and $(Ba,Sr)_2SiO_4:Eu^{2+}$. Examples of yellow phosphor materials include $(Sr,Ba)_2SiO_4:Eu^{2+}$. Examples of red phosphor materials include $La_2O_2S:Eu^{3+}$, $CaS:Eu^{2+}$, and $Sr_2Si_5N_8:Eu^{2+}$.

Similarly to the semiconductor light emitting device 10 of the embodiment 1, the semiconductor light emitting device 80 having the above structure is mounted on a printed wiring board or the like to be ready for use.

On application of an electric current via the first and second power supply terminals 114 and 116, each light emission layer 90 emits ultraviolet light at a wavelength of 380 nm. Part of the ultraviolet light is converted by the phosphor 86 into blue, green, yellow, and red light. A mixture of the four colors of light produces white light. Here, since the white light is emitted from the LEDs 84A-84F arranged to form a substantially regular hexagonal shape in plan view, the beam spot is more circular than a beam spot emitted by a conventional square-shaped LED chip. In addition, according to the embodiment 2, the phosphor 86 is in a cylindrical shape. Hence, the beam spot is even more circular than that consistent with the embodiment 1.

Next, a description is given to the steps of manufacturing the semiconductor light emitting device 80 consistent with the embodiment 2, with reference to FIGS. 10-13. In FIGS. 10-13, the materials of the components of the semiconductor light emitting device 80 are denoted by reference numerals in the two thousands and its last three digits correspond to the reference numerals denoting the respective components.

First, as shown in FIG. 10, a semiconductor multilayer structure 2094 is formed by epitaxially growing the following layers in the stated order over the (0001) plane of the single crystal substrate 144 by, for example, MOCVD (Step A2). That is, a GaN sacrificial layer (not illustrated), an n-AlGaN layer 2092 which will later constitute the second conductive layer 92 (FIG. 9), an AlGaN/InGaN MQW light emission layer 2090 which will later constitute the light emission layer 90 (FIG. 9), a p-AlGaN layer 2088 which will later constitute the first conductive layer 88 (FIG. 9) are sequentially deposited in the stated order. Here, a sapphire substrate having the HCP crystal structure is used as the single crystal substrate 144.

In the surface of the semiconductor multilayer structure 2094, dividing grooves 146 are formed to a depth reaching the single crystal substrate 144, whereby the semiconductor multilayer structure 2094 is divided into a number of regular triangle pieces (Step B2).

Passivation films 148 are formed with silicon nitride by, for example, sputtering (Step C2). The passivation films 148 coat the bottom surfaces and the side walls of the dividing grooves 146 (i.e. the lateral surfaces of the regular triangle pieces of the semiconductor multilayer structure 2094), as well as part of the upper surfaces of the regular triangle pieces of the semiconductor multilayer structure 2094. Although the passivation films 148 remain in the finished semiconductor light emitting device 80, the passivation films 148 are not shown in the figures, except in FIGS. 10 and 11.

Figure 11A:
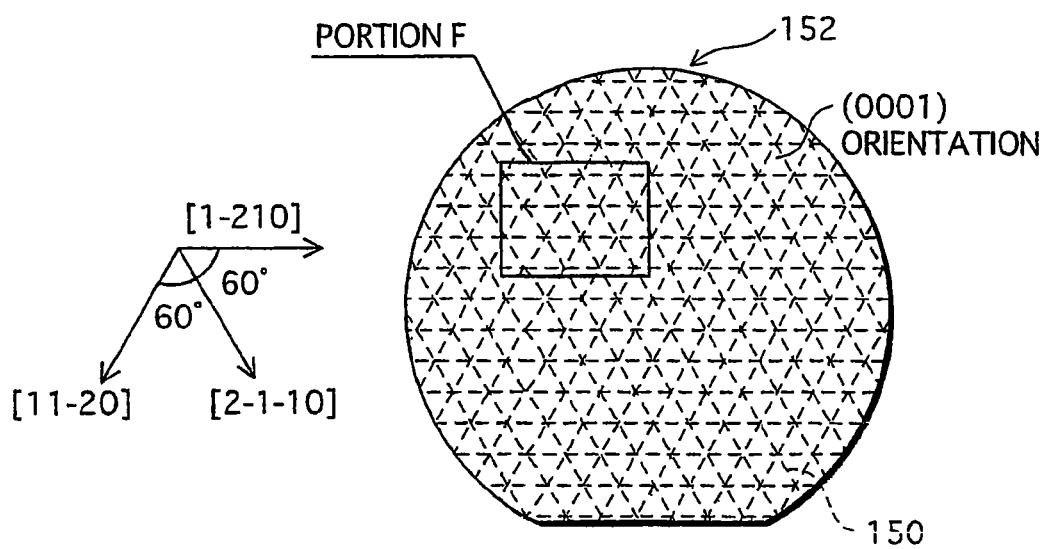
FIG. 11 are views showing a manufacturing step of the semiconductor light emitting device of the embodiment 2.
Figure 11B:
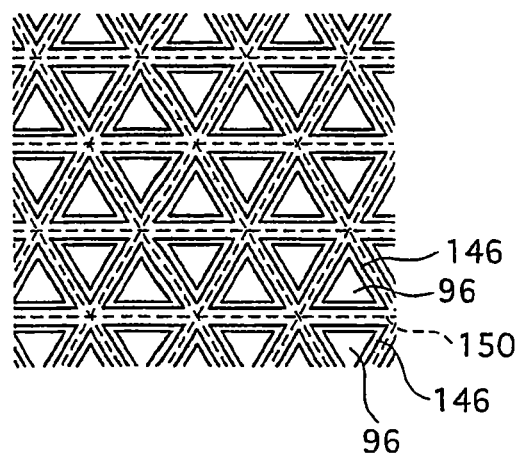

Next, a stack of Rh/Pt/Au films is formed on the upper surface of the first conductive layer 88 by, for example, electron beam evaporation (Step D2), thereby to constitute the first electrode 96. In addition, cleavage guide grooves 150 are formed in the undersurface of the single crystal substrate 144 by, for example, dry etching (Step D2). Basically, the step of forming the guide grooves 150 is similar to the step F1 (FIG. 4) of forming the guide grooves 68 (FIG. 4) consistent with the embodiment 1, except for the groove pattern. More specifically, in the embodiment 1, the guide grooves 68 are formed so as to partition the wafer into a plurality of rhombus areas (See FIG. 5). In the embodiment 2, however, the guide grooves 150 are formed as shown in FIG. 11 so as to partition the wafer 152 into regular triangle areas.

By cleaving along the guide grooves 150, the single crystal substrate 144 is divided into separate LED chips 154 (Step E2).

Similarly to the embodiment 1, by cleaving along the crystallographic planes, chipping and cracking of the semiconductor multilayer structure at the time of dicing are suppressed. In addition, the semiconductor multilayer structure 2094 is fully used without waste, except along the outer periphery where no more regular triangle areas can be formed. Thus, similarly to the embodiment 1, the better use of the single crystal substrate is ensured in comparison with the conventional example shown in FIG. 31.

Now, with reference to FIGS. 12 and 13, a description is given to the steps of manufacturing the base substrate 82 (FIG. 8) and of mounting the LED chips 84 onto the base substrate 82. Note that FIGS. 12 and 13 showing the manufacturing steps are sectional views taken along the line E-E of the semiconductor light emitting device 80 shown in FIG. 8B.

First, an insulating substrate 2100 made of AlN and having plated-through-holes 118-124 (not illustrated in FIG. 12, see FIG. 8) is prepared (Step F2).

In predetermined areas of the upper surface of the insulating substrate 2100, stacks of Ti/Pt/Au films are formed by, for example, sputtering, thereby to provide the first to sixth conductive patterns 102-112 (FIG. 8). In addition, in predetermined areas of the upper surface of the insulating substrate 2100, stacks of Ni/Au films are formed by, for example, plating, thereby to provide the first and second power supply terminals 114 and 116 (FIG. 8). (Step G2)

In predetermined areas of the first to sixth conductive patterns 102-112 (FIG. 8), an AuSn films 2126A-2126F (2126D-2126E are not shown in the figure) are formed by, for example, plating (Step H2). The AuSn films 2126A-2126F will later constitute the bonding layers 126.

Each LED chip 154 obtained in the step E2 is joined to the insulating substrate 2100 (Step J2). More specifically, the first electrode 96 is faced downward, and the AuSn film 2126 is pressed against the first electrode 96. In this state, the AuSn film 2126 is heated to be fused and joined to the first electrode 96.

Next, to remove the single crystal substrates (sapphire substrates) 144 from the LED chips, the single crystal substrates 144 are irradiated with a YAG laser beam LB of a third harmonic emitted at 355 nm. The laser beam LB passes through the single crystal substrates (sapphire substrates) 144 without being absorbed. Absorption of the laser beam LB occurs exclusively at the GaN sacrificial layers (not illustrated), so that exothermic heat is locally developed. The local heat induces decomposition of the GaN bond in the vicinity of the interfaces of the GaN sacrificial layers. As a result, the single crystal substrates (sapphire substrates) 144 come to be separated from the semiconductor multilayer structures 94 (second conductive layers 92) in terms of the crystal structure. Yet, the single crystal substrates 144 are still physically attached to the semiconductor multilayer structures 94 via layers containing metallic Ga. The single crystal substrates 144 are completely removed from the semiconductor multilayer structures 94 by immersion in, for example, a hydrochloric acid to dissolve portions in the vicinity of the interfaces. (Step K2)

Next, to form the insulating films 138, 140, and 142, silicon nitride films are formed to coat lateral surfaces of the semiconductor multilayer structure 94 by, for example, sputtering (Step L2).

Next, stacks of Ti/Pt/Au films are formed by, for example, sputtering in predetermined areas to provide the second electrodes 98A-98C as well as bridge wiring 132, 134, and 136 (Step M2).

A silicone resin containing phosphor particles and thixotropy such as aerosil is applied by, for example, screen printing to cover all the LEDs 84A-84F (LEDs 84D and 84F are not illustrated in FIG. 13). Here, the silicon resin is applied substantially into a cylindrical shape and thermally cured to form the phosphor 86. (Step N2)

The insulating substrate 2100 is cut into pieces with a dicing blade DB (Step Q2). Each piece constitutes a finished semiconductor light emitting device 80.

According to the embodiment 2, the LED chips are manufactured using cleavage along the crystallographic planes, to each have a substantially regular triangular shape in plan view. For implementing such cleavage, the semiconductor multilayer structures each including a light emission layer are grown on an HCP single crystal substrate. The HCP single crystal substrate is divided into separate LED chips using the dicing blade DB, which is used in the step Q2 shown in FIG. 13, a laser beam, or wet etching, so that the dicing may be carried out along lines that may or may not coincide with the crystallographic planes. In the case where the dicing is carried out along the lines which do not coincide with the crystallographic planes, the semiconductor multilayer structures may be grown on a substrate, such as an Si substrate, not having the HCP crystal structure. By dividing the substrate into pieces in a pattern shown in 11A, separate LED chips each having a substantially regular triangular shape can be obtained.

Note in the case of dicing with a dicing blade, there is a risk of chipping and cracking of LED chips, and the risk increases when the wafer (i.e. the substrate) is hard. In the case of dicing with a laser beam, it is preferable to carry out the dicing with a lowest possible power in order to avoid any damage to the light emission layers. In view of the above, a thinner wafer is more preferable.

Embodiment 3

Figure 14A:
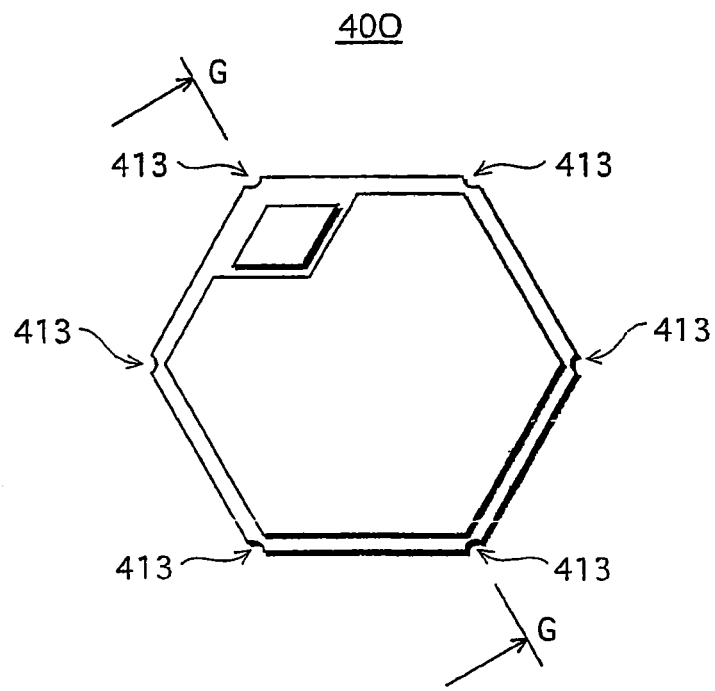
FIG. 14 are views showing a semiconductor light emitting element manufactured by a method consistent with an embodiment 3 of the present invention.
Figure 14B:
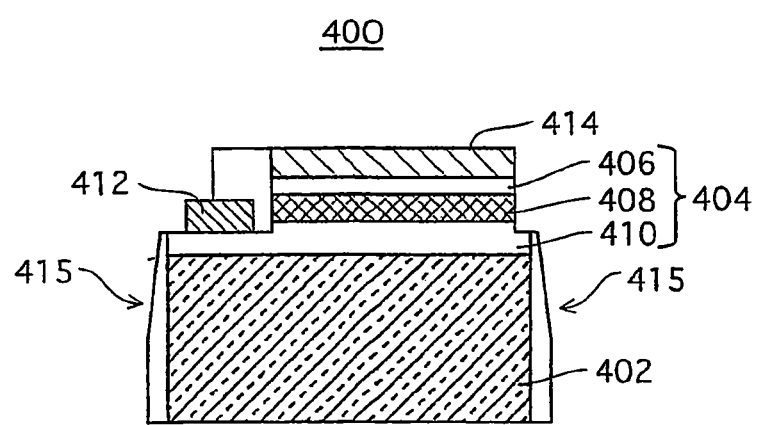

FIG. 14 show an LED chip 400 which is a semiconductor light emitting element manufactured by the method consistent with an embodiment 3 of the present invention. FIG. 14A is a plan view of the LED chip 400 and FIG. 14B is a sectional view taken along the line G-G of FIG. 14A.

As shown in FIG. 14A, the LED chip 400 is in a substantially regular hexagonal shape in plan view. As shown in FIG. 14B, the LED chip 400 is composed of a single crystal substrate 402 and a semiconductor multilayer structure (multilayer paraxial structure) 404. The semiconductor multilayer structure 404 is composed of a first conductive layer 406 of a first conductive type made of a p-GaN layer, a light emission layer 408 made of an InGaN/GaN MQW layer, a second conductive layer 410 of a second conductive type made of an n-GaN layer in the stated order from the top (i.e. from the side further away from the single crystal substrate 402). The semiconductor multilayer structure 404 constitutes a diode. Note that the single crystal substrate 402 is made of an n-GaN, and the semiconductor multilayer structure 404 was epitaxially grown thereon.

When seen the LED chip 400 from the above, a corner portion of the substantially regular hexagonal semiconductor multilayer structure 404 is removed in a substantially rhombus shape. In the thickness direction of the layers, the removed portion extends from the first conductive layer 406 to some midpoint in the second conductive layer 410. That is, as a result of the removal, an area of the second conductive layer 410 is exposed in the shape of a rhombus. On the rhombus area of the second conductive layer 410, an n-electrode is formed as a second electrode 412. On the upper surface of the first conductive layer 406, a p-electrode is formed as a first electrode 414. The second electrode 412 is made of a stack of Ti/Au films, whereas the first electrode 414 is made of a stack of Rh/Pt/Au films.

As shown in FIG. 14A, each vertex of the substantially regular hexagonal LED chip 400 (portions denoted by the reference numeral 413) is cut away to leave an arc-shaped recess. Each arc-shaped recess is cut to curve inward towards the center of the single crystal substrate. These recesses are present as a result of holes 162 (FIG. 17) formed in or through a wafer 156 in a later-described manufacturing step. In addition, portions 415 of the lateral sides of LED chip 400 are slanted, as shown in FIG. 14B, as a result of guide grooves 164 (FIG. 18) formed in the surface of the wafer 156 in a later-described manufacturing step.

Now, a description is given to a manufacturing method of the LED chip 400 having the above structure, with reference to FIGS. 15-19. In FIGS. 15-19, the materials of the components of the LED chip 400 are denoted by reference numerals in the three thousands and its last three digits correspond to the reference numerals denoting the corresponding components.

First, as shown in FIG. 15, a semiconductor multilayer structure 3404 is formed by epitaxially growing the following layers in the stated order over the (0001) plane of an n-GaN single crystal substrate 3402 by MOCVD. That is, an n-GaN layer 3410 which will later constitute the second conductive layer 410 (FIG. 14), an InGaN/GaN MQW light emission layer 3408 which will later constitute the light emission layer 408 (FIG. 14), a p-GaN layer 3406 which will later constitute the first conductive layer 406 (FIG. 14) are deposited in the stated order. Then, a stack 3414 of Rh/Pt/Au films is formed on the upper surface of the p-GaN layer 3406 by, for example, electron beam evaporation. The Rh/Pt/Au film stack 3414 will later constitute the first electrode 414 (FIG. 14). (Step A3)

In order to create the area (the rhombus area) for forming the second electrode 412 (FIG. 14), part of the n-GaN layer 3410, InGaN/GaN MQW light emission layer 3408, p-GaN layer 3406, and Rh/Pt/Au film stack 3414 is removed by, for example, dry etching (Step B3).

On the rhombus area, a stack 3412 of Ti/Au films which will later constitute the second electrode 412 (FIG. 14) is formed (Step C3).

Figure 16A:
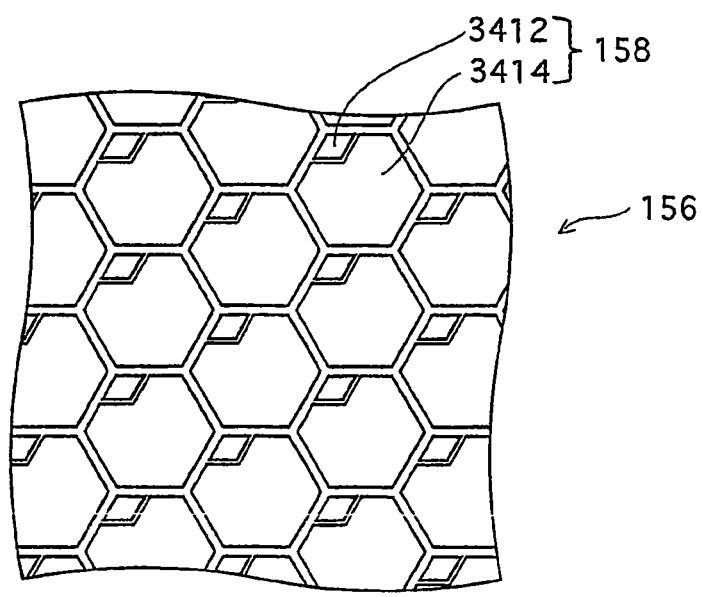
FIG. 16 are views showing a step of the manufacturing method of the embodiment 3.
Figure 16B:
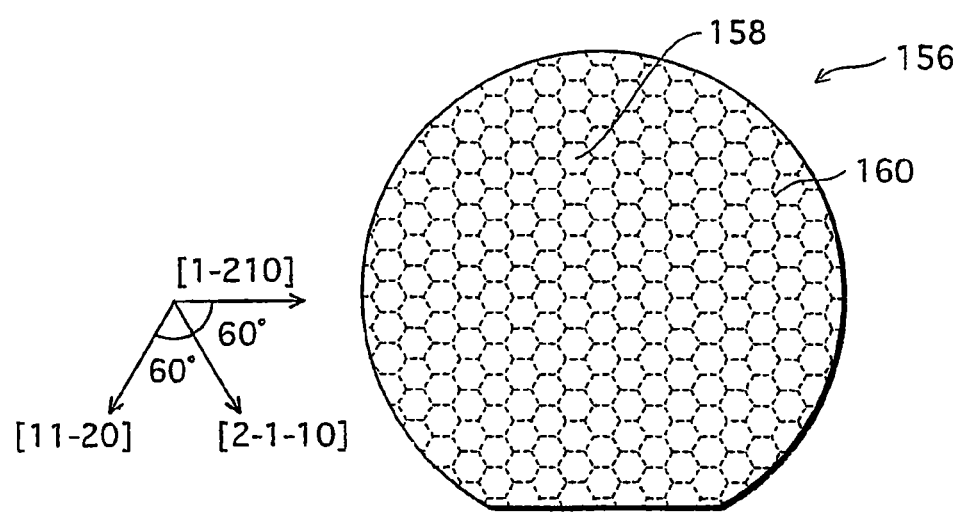
Figure 19:
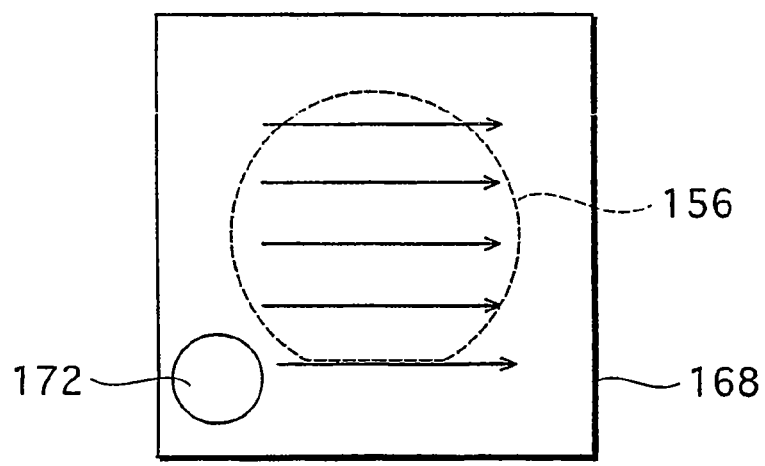
FIG. 19 is a view showing a manufacturing step of the manufacturing method of the embodiment 3.

FIG. 16A is an enlarged plan view of the wafer 156 in the state where the Step C3 is done. As shown in FIG. 16A, on the wafer 156, a plurality of substantially regular hexagons 158 (hereinafter, simply "regular hexagon 158") are formed each with a Ti/Au film stack 3412 and an Rh/Pt/Au film stack 3414 that is laid on the semiconductor multilayer structure 3404 (FIG. 15, Step C3). For the purpose of clear illustration, FIG. 16B shows the entire wafer 156 with broken lines representing midlines 160 passing through midpoints between boundaries of adjacent regular hexagons 158. As shown in FIG. 16B, the wafer 156 is partitioned into a honeycomb pattern with a hexagonal arrangement. That is, the wafer 158 is partitioned into areas of a uniform shape (regular hexagon), except along the periphery of the wafer 156. In addition, each side of each hexagon 158 coincides with one of the [1-210], [2-1-10], [11-20] orientations. The reason for choosing such partitioning will be described later.

Referring back to FIG. 15, the surface of the single crystal substrate 3402 facing away from the semiconductor multilayer structure 3404 is ground by, for example, mechanical grinding, until the thickness reaches 100 μm or so (Step D3).

Next, as shown in FIG. 17, a hole 162 is formed at each location pointed by a vertex of each of three adjacent regular hexagons 158 (Step E3). In other words, as in the enlarged portion K shown in FIG. 17, a hole 162 is formed at each location where vertexes of three adjacent regular hexagons defined by the midlines 162 meet. The holes 162 may be formed by, for example, dry etching or laser. In addition, the holes 162 may be through holes or non-through holes. Yet, in the case of non-through holes, the depth need to be greater than the depth of guide grooves 164 which will be described later. The reason for forming the holes 162 will also be described later.

Next, as shown in FIG. 18, the cleavage guide grooves 164 are formed by, for example, dry etching in the surface of the wafer 156 from the side of the semiconductor multilayer structure 3404 (Step F3). The guide grooves 164 are formed along the midlines 160 (FIGS. 16 and 17), so that the single crystal substrate 3402 is partitioned into a honeycomb pattern with hexagonal areas. It goes without saying that each side of each hexagonal area coincides with one of the [1-210], [2-1-10], [11-20] orientations.

Next, an elastic sheet 168 is adhesively attached to the single crystal substrate 3402, and the wafer 156 is mounted over a table 170 via another elastic sheet 166. A substantially spherical pressure-applying member 172 made of an elastic material is rolled over the sheet 168 in the arrowed direction shown in FIG. 19 across the wafer 156 a several times. While rolling, the pressure-applying member 172 is pressed against the sheet 168 (i.e. pressure is applied to the single crystal substrate via the sheet 168). (Step G3)

As a result, the wafer 156 (single crystal substrate 3402) is cleaved along the guide grooves 164 into separate LED chips (Step H3).

In the case where guide grooves extend linearly across the wafer as in the embodiments 1 and 2 (FIGS. 5 and 11), cleaving is carried out without a problem. However, as in the embodiment 3 where guide grooves is formed in a complex pattern, cleaving involves a risk of cracks at unexpected locations (locations other than the guide grooves). That is, a crack produced along one line segment of the guide grooves develops beyond the end point of the line segment. In order to prevent such unintentional cracks, the embodiment 3 provides the holes 162 (FIG. 17) described above. The presence of the holes 162 stops the cracks from running any farther, so that there will be no unintentional cracks.

Similarly to the embodiments 1 and 2, by cleaving along the crystallographic planes, chipping and cracking of the semiconductor multilayer structure at the time of dicing are suppressed. Also similarly to the embodiments 1 and 2, in addition, the single crystal substrate 3402 is fully used without waste, except for the periphery where no more regular hexagonal areas can be formed. That is, the better use of the single crystal substrate 3402 is ensured in comparison with the conventional example shown in FIG. 31. More specifically, in the embodiment 3 similarly to the embodiments 1 and 2, the single crystal substrate is partitioned into areas of a uniform shape with the guide grooves, and divided into separate pieces (LED chips) along the guide grooves. Consequently, the single crystal structure substrate is used with minimum wastage.

In addition, according to the embodiment 3, each LED chip 400 in itself is has a substantially regular hexagonal shape. Thus, unlike the embodiments 1 and 2, it is not necessary to use a plurality of LED chips in combination. Note that it goes without saying that the LED chip 400 may be used in combination with a phosphor (by disposing the phosphor to cover the LED chip 400) to constitute a white LED.

It is also applicable, of course, that a plurality of LED chips 400 may be used in combination to constitute a semiconductor light emitting device, similarly to the embodiments 1 and 2.

FIG. 20 show an example of such a semiconductor light emitting device.

Figure 20A:
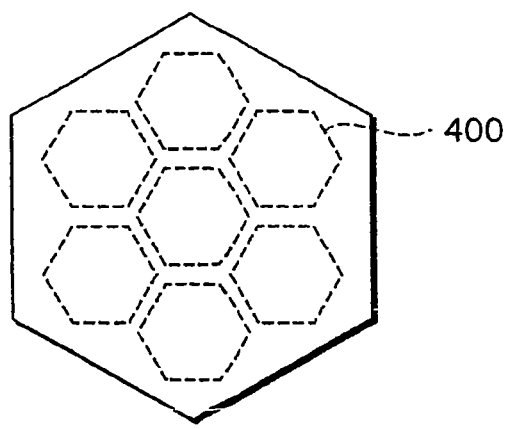
FIG. 20 are views showing a semiconductor light emitting device consistent with the embodiment 3.

FIG. 20A shows a semiconductor light emitting device 420 composed of seven LED chips 400 arranged to form, as a whole, a substantially regular hexagonal shape in plan view.

The semiconductor light emitting device 420 is basically similar in structure to the semiconductor light emitting device 10 (FIG. 1) of the embodiment 1, except the conductive patterns and the like formed on the insulating substrate. Thus, no detailed description is given.

Figure 20B:
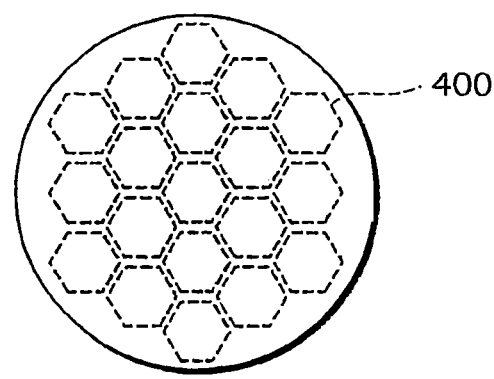

FIG. 20B shows a semiconductor light emitting device 422 composed of nineteen LED chips 400 arranged to form, as a whole, a substantially regular hexagonal shape in plan view.

The semiconductor light emitting device 422 is basically similar in structure to the semiconductor light emitting device 10 (FIG. 1) of the embodiment 1, except the conductive patterns and the like formed on the insulating substrate. Thus, no detailed description is given.

Embodiment 4

The LED chip 400 consistent with the embodiment 3 above is designed for flip-chip mounting and has both the p- and n-electrodes on the same main surface of the single crystal substrate. On the contrary, an LED chip 500 manufactured in the method consistent with an embodiment 4 of the present invention has a p-electrode and an n-electrode on mutually different main surfaces of the single crystal substrate.

Figure 21A:
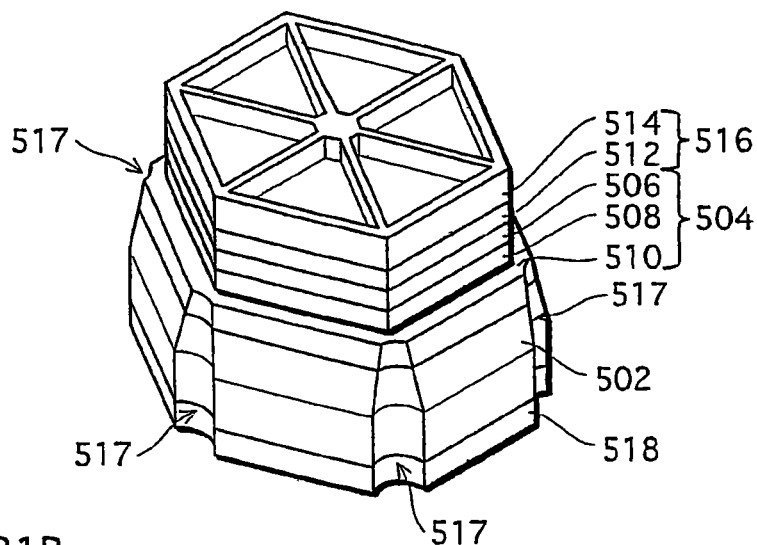
FIG. 21 are views showing a semiconductor light emitting element manufactured by a method consistent with an embodiment 4 of the present invention.
Figure 21B:
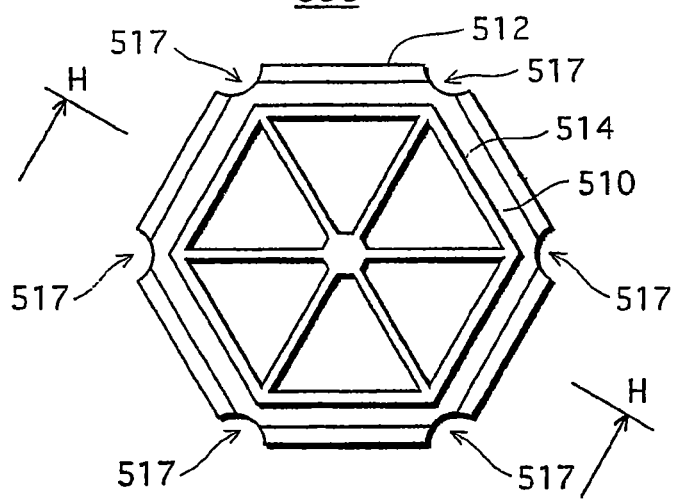

FIG. 21A is an oblique view and FIG. 21B is a plan view of the LED chip 500. FIG. 21B is a sectional view of the LED chip 500 taken along the line H-H of FIG. 21B.

As shown in FIG. 21B, the LED chip 500 is in a substantially regular hexagonal shape in plan view. As shown in FIGS. 14A and 14B, the LED chip 500 is composed of an HCP single crystal substrate 502 and a semiconductor multiplayer structure (multilayer epitaxial structure) 504. The semiconductor multilayer structure 504 is composed of a first conductive layer 506 of a first conductive type made of p-GaN layer, a light emission layer 508 made of an InGaN/GaN MQW layer, a second conductive layer 510 of a second conductive type made of an n-GaN layer in the stated order from the top (from the side further away from the HCP single crystal substrate 502). The semiconductor multilayer structure 504 constitutes a diode. Note that the HCP single crystal substrate 502 is made of an n-GaN substrate on which the semiconductor multilayer structure 504 was epitaxially grown.

On the entire surface of the first conducive layer 506, a transparent electrode 512 made of ITO coating is formed. On the upper surface of the transparent electrode 512, a contact electrode 514 made of a stack of Ti/Pt/Au films is formed. In this embodiment, the transparent electrode 512 and the contact electrode 514 constitute a first electrode 514, which is a p-electrode. The contact electrode 514 is composed of a regular hexagonal rim portion and a spoke portion extending from the center of the hexagon to the vertexes of the hexagonal rim.

On the entire undersurface of the single crystal substrate 502, an n-electrode is formed as a second electrode 518. The second electrode is made of a stack of Ni/Ag/Pt/Au films.

Figure 21C:
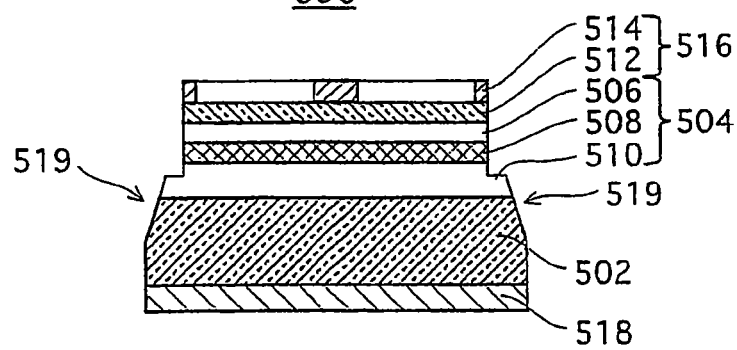

As shown in FIGS. 21A and 21B, each vertex of the substantially regular hexagonal LED chip 500 (portions denoted by the reference numeral 517) is cut away to leave an arc-shaped recess. Each arc-shaped recess is cut to curve inward towards the center of the single crystal substrate. These recesses are present as a result of holes 178 (FIG. 25) formed in or through a wafer 174 in a later-described manufacturing step. In addition, portions 519 of the lateral sides of LED chip 500 are slanted, as shown in FIG. 21 C, as a result of guide grooves 182 (FIG. 24) formed in the surface of the wafer 174 in a later-described manufacturing step.

When mounting the LED chip 500 having the above structure onto, for example, a printed wiring board, the second electrode 518 is bonded directly to a bonding pad of the printed wiring board. In addition, the first electrode 516 is electrically connected at the center thereof (where the spokes meet) to another bonding pad of the printed wiring board with a bonding wire.

Next, a description is given to the manufacturing method of the LED chip 500, with reference to FIGS. 22-25. In FIGS. 22-25, the materials of the components of the LED chip 500 are denoted by reference numerals in the four thousands and its last three digits correspond to the reference numerals denoting the corresponding components.

First, as shown in FIG. 22, a semiconductor multilayer structure 4504 is formed by epitaxially growing the following layers in the stated order over the (0001) plane of an n-GaN single crystal substrate 4502 by MOCVD (Step A4). That is, an n-GaN layer 4510 which will later constitute the second conductive layer 510 (FIG. 21), an InGaN/GaN MQW light emission layer 4508 which will later constitute the light emission layer 4508 (FIG. 21), a p-GaN layer 4506 which will later constitute the first conductive layer 506 (FIG. 21) are sequentially deposited in the stated order.

Figure 23:
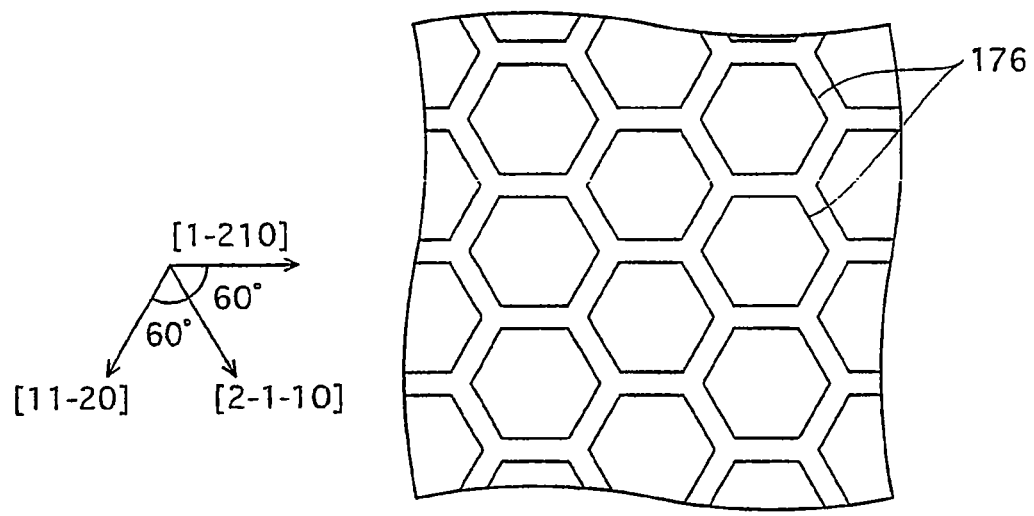
FIG. 23 is a view showing a step of the manufacturing method of the embodiment 4.

Portions the semiconductor multiplayer structure 4504 (i.e. portions of the n-GaN layer 4510, InGaN/GaN MQW layer 4508, p-GaN layer 4506) are removed to a depth reaching some midpoint in the n-GaN layer 4510 by, for example, dry etching, so as to leave a plurality of regular hexagonal prisms formed with the upper part of the semiconductor multilayer structure 4504 (Step B4). FIG. 23 is an enlarged view of a portion the wafer 174 in the state where the step B4 is done. As shown in FIG. 23, the semiconductor multiplayer structure 4504 is partitioned into substantially regular hexagonal shapes 176 in plan view (hereinafter, simply "regular hexagons 176"). The pattern in which the regular hexagons 176 are arranged are identical to that described in the embodiment 3 (see for example FIG. 16).

Referring back to FIG. 22, an ITO coating 4512 is formed on the upper surface of the p-GaN layer 4508 by, for example, sputtering (Step C4). The ITO coating 4512 will later constitute the transparent electrode 512 (FIG. 21).

Next, a stack of Ti/Pt/Au films 4516 is formed by, for example, electron beam evaporation (Step D4). The Ti/Pt/Au film stack 4516 will later constitute the contact electrode 516 (FIG. 21).

The surface of the single crystal substrate 4502 facing away from the semiconductor multilayer structure 4504 is ground by, for example, mechanical grinding, until the thickness reaches 100 µm or so (Step E4).

Referring now to FIG. 24, a stack of Ni/Ag/Pt/Au films 4518 is formed on the ground surface of the single crystal substrate 4504 (Step F4). The Ni/Ag/Pt/Au film stack will later constitute the second electrode 518 (FIG. 21).

Figure 25:
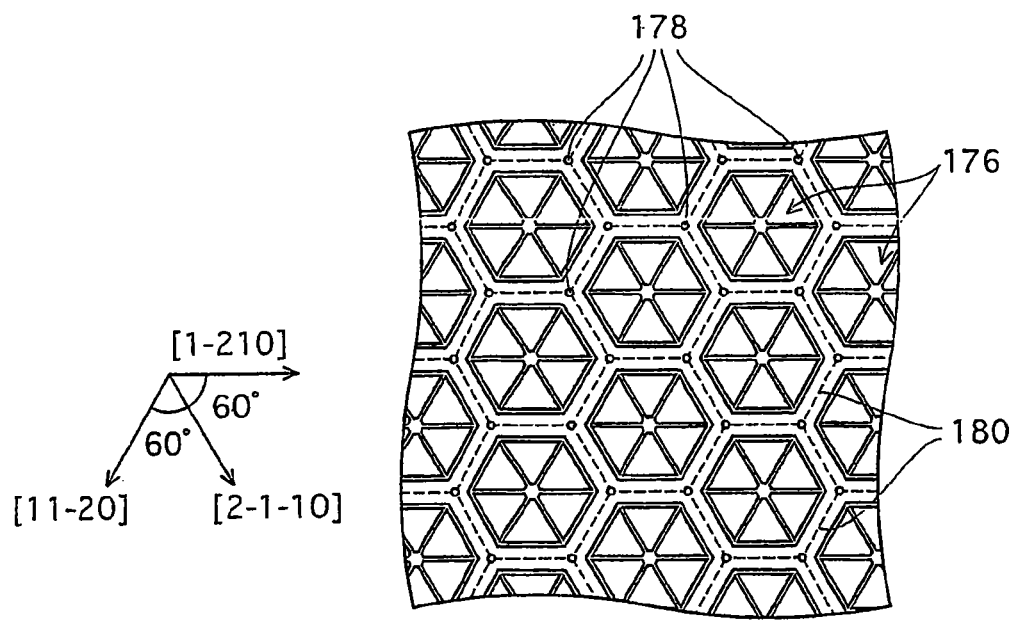
FIG. 25 is a view showing a step of the manufacturing method of the embodiment 4.

Next, as shown in FIG. 25, holes 178 are formed for the similar reason to the embodiment 3, i.e. for preventing occurrences of undesirable cracks at the time of cleavage, (Step G4). Note that the broken lines shown in FIG. 25 represent midlines 180 between boundaries of adjacent regular hexagons 176.

Referring back to FIG. 24, cleavage guide grooves 182 are formed by, for example, dry etching in the surface of the wafer 174 from the side of the semiconductor multilayer structure 4504 (Step H4). The guide grooves 182 are formed along the midlines 180 (FIG. 25), so that the single crystal substrate 4502 is partitioned into a honeycomb pattern with hexagonal areas. It goes without saying that each side of each hexagonal area coincides with one of the [1-210], [2-1-10], [11-20] orientations.

Next, similarly to the embodiment 3, an elastic sheet 168 is adhesively attached to the wafer 174, and the wafer 174 is mounted over a table 170 via another elastic sheet 166. A substantially spherical pressure-applying member 172 made of an elastic material is rolled over the sheet 168 across the wafer 174 a several times while pressing the pressure-applying member 172 against the sheet 168. (Step J4)

As a result, the wafer 174 (single crystal substrate 4502) is cleaved along the guide grooves 182 and divided into separate LED chips 500 (Step K4).

The LED chips 500 are removed from the sheets 166 and 168 to be ready for use.

The manufacturing method of the embodiment 4 achieves the same effect as that achieved by the embodiment 3. Thus, no disruption is given thereto.

Also similarly to the embodiment 3, a plurality of LED chips 500 may be used to constitute a semiconductor light emitting device by arranging the LED chips 500 to together form a substantially regular hexagonal shape.

Embodiment 5

Figure 26:
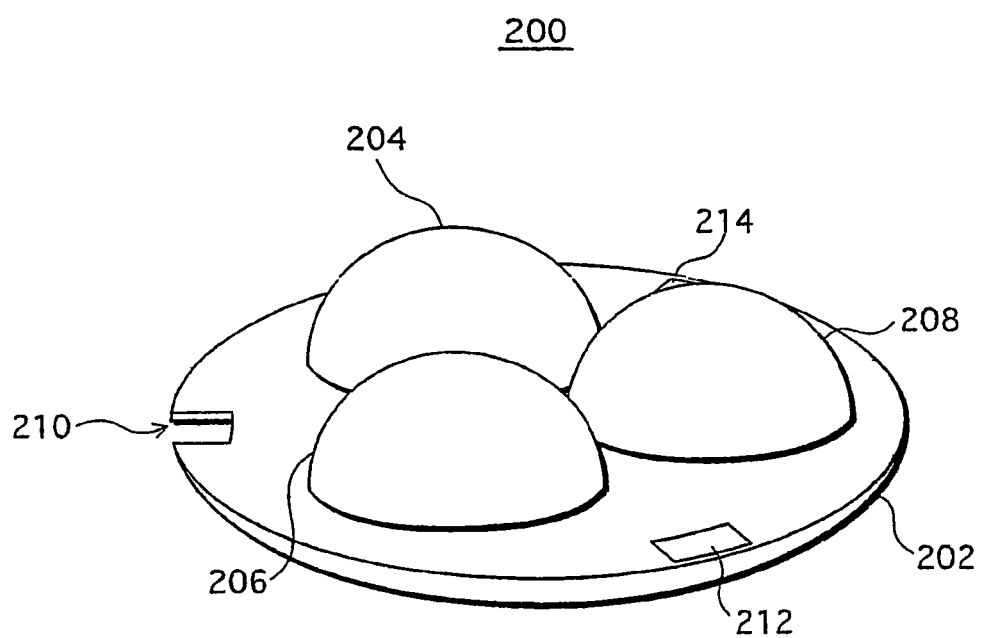
FIG. 26 is an oblique view showing an LED module.

FIG. 26 is an external oblique view of a white LED module 200 having the semiconductor light emitting devices 10 consistent with the embodiment 1 (hereinafter simply "LED module 200"). Instead of the semiconductor light emitting devices 10, the LED module 200 may have the semiconductor light emitting devices 80 (see FIG. 8, for example) consistent with the embodiment 2, or the semiconductor light emitting devices 420 or 422 (See FIG. 20) consistent with the embodiment 3. Yet, in this embodiment, a description is given as an example to the LED module 200 having the semiconductor light emitting devices 10 consistent with the embodiment 1. Note that the LED module 200 is fixed to a later-described illumination fixture 240 (FIG. 29) to be ready for use.

The LED module 200 includes, as a mounting substrate, a circular ceramic substrate 202 which measures 5 cm in diameter and made of AlN. The LED module 200 also includes three glass lenses 204, 206, and 208. The ceramic substrate 202 is provided with a guide notch 210 for attachment to the illumination fixer 240, and positive and negative terminals 212 and 214 for power supply from the illumination fixture 240.

Figure 27A:
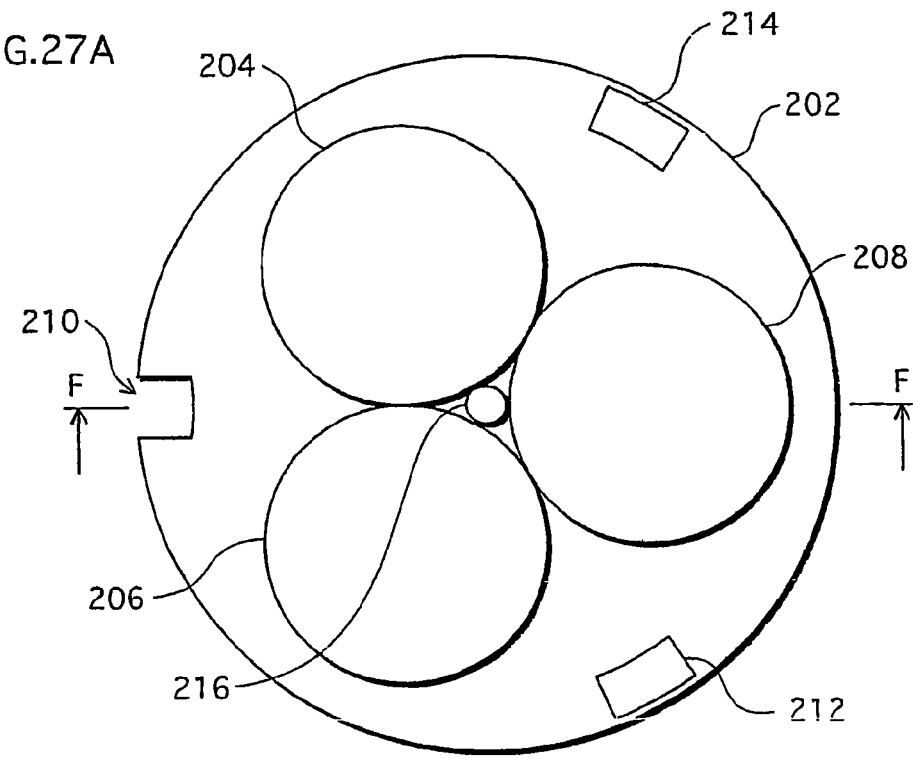
FIG. 27A is a plan view of the LED module.
Figure 27B:
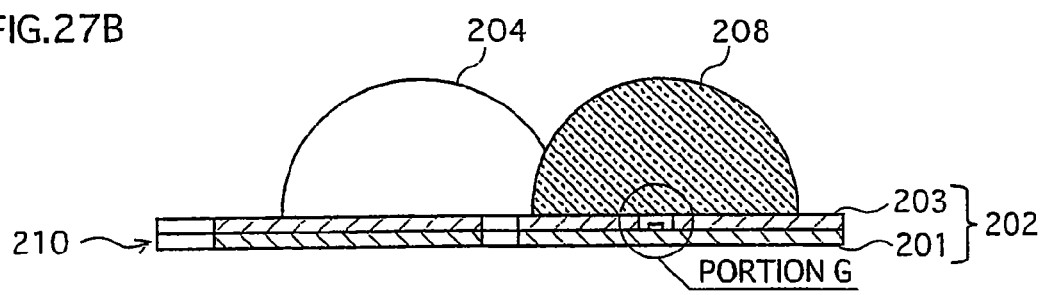
FIG. 27B is a sectional view of the LED module taken along the line F-F of FIG. 27A.
Figure 27C:
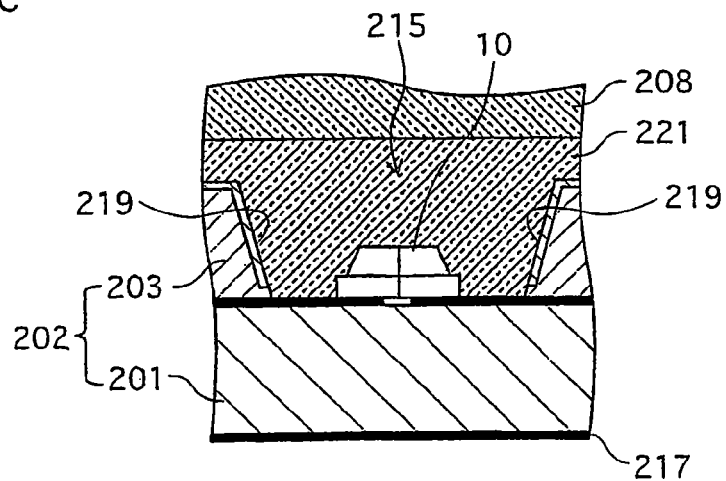
FIG. 27C is an enlarged view showing a portion G of FIG. 27B.

FIG. 27A is a plan view of the LED module 200. FIG. 27B is a sectional view of the LED module 200 taken along the line F-F of FIG. 27A. FIG. 27C is an enlarged view showing a portion G of FIG. 27B.

As shown in FIGS. 27A and 27B, the ceramic substrate 202 has a guide hole (through hole) 216 at the center thereof, for attachment to the illumination fixture 240. In addition, the undersurface of the ceramic substrate 202 is coated with gold plating 217 in order to improve thermal dissipation.

The semiconductor light emitting devices 10 (numbering three in total) are mounted on the ceramic substrate 202 each at a location corresponding to the center of a respective one of the lenses 204, 206, and 208 illustrated as a circle in FIG. 27A.

The ceramic substrate 202 is a stack of two ceramic substrates 201 and 203 each of which is 0.5 mm thick and made mainly of AlN. Alternatively to AlN, the ceramic substrates 201 and 203 may be made of various materials including $Al_2O_3$, BN, MgO, ZnO, SiC, and diamond.

The semiconductor light emitting devices 10 are mounted on the ceramic substrate 201, which is the lower layer, in a manner that the first and second power supply terminals 42 and 44 (see FIG. 1) face toward the ceramic substrate 201. The ceramic substrate 203, which is the upper layer, is provided with downwardly and internally tapered through holes 215 each for securing mounting space of a semiconductor light emitting device 10. In other words, the ceramic substrate 202 has recesses each of which is diametrically larger toward the opening, and each semiconductor light emitting device 10 is mounted on the bottom of a respective one of the recesses. Yet, the through holes forming the recesses do not have to be tapered. The through holes may define a bowl-like profile, for example.

An aluminum reflecting film 219 of a substantially uniform thickness is provided to coat the upper surface of the upper ceramic substrate 203 as well as the inner walls of the through holes 215 formed through the ceramic substrate 203. With the provision of the aluminum reflecting film 219, reflectors (reflector holes) are formed. Each through hole 215 is formed (designed) to have such a shape that white light emitted from lateral sides of the semiconductor light emitting devices 10 is reflected by the aluminum reflecting film 219 in a direction substantially perpendicular to the main surface of the ceramic substrate 203.

A pair of cathode pad 218 and an anode pad 220 (shown in FIG. 28B) is provided at each location, on the upper surface of the ceramic substrate 201, where a respective one of the semiconductor light emitting devices 10 is to be mounted. Each pad is made up of copper (Cu) plated with nickel (Ni) and then with gold (Au). Each semiconductor light emitting device 10 is mounted with the base substrate 12 faced downward. For mounting, the second power supply terminal 44 is soldered to the cathode pad 218, whereas the first power supply terminal 42 is soldered to the anode pad 202. Instead of solder, gold bumps or a silver paste may be used for joining the power supply terminals to the pads.

The lenses 204, 206 and 208 are adhered to the ceramic substrate 203 by an adhesive agent 221. The adhesive agent 221 may be a silicone resin, an epoxy resin, or the like.

The three semiconductor light emitting devices 10 are connected in parallel by a wiring pattern formed on the upper surface of the ceramic substrate 201.

Figure 28A:
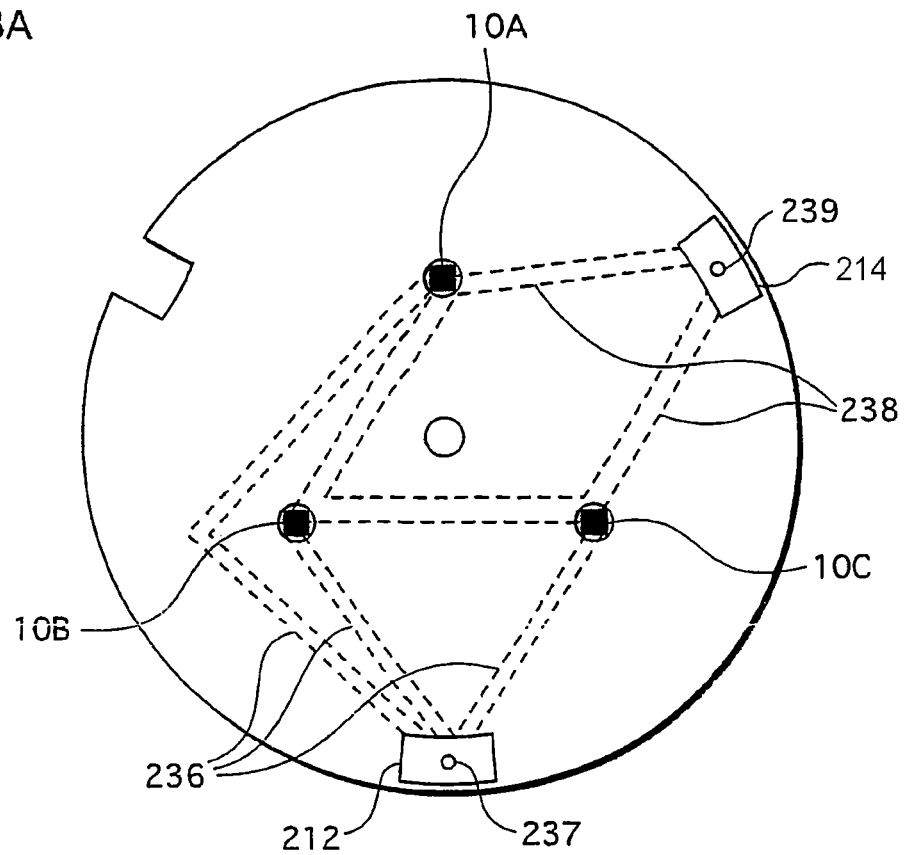
FIG. 28A is a plan view showing the LED module without lenses.
Figure 28B:
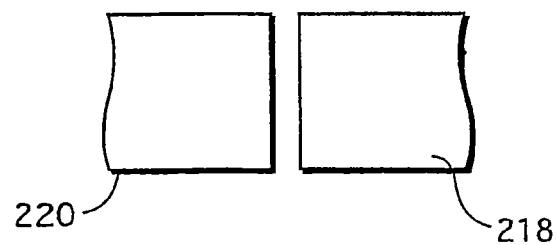
FIG. 28B is a view showing a pattern of pads disposed on a ceramic substrate constituting the LED module.

FIG. 28A is a plan view showing the LED module 200 without the lenses 204, 206, and 208. In FIG. 28A, the three semiconductor light emitting devices 10 are denoted with letters A, B, and C so as to distinguish one from another.

As described above, a pair of the anode pad 220 and the cathode pad 218 (FIG. 28B) is provided at each location, on the upper surface of the ceramic substrate 201, where a respective one of the semiconductor light emitting devices 10A, 10B and 10C is to be mounted.

The anode pads 220 connected to the semiconductor light emitting devices 10A, 10B and 10C are electrically connected to one another by a wiring pattern 236. The wiring pattern 236 is connected to the positive terminal 212 at its end via a plated-through hole 237. Similarly, the cathode pads 218 connected to the semiconductor light emitting devices 10A, 10B and 10C are electrically connected to one another by a wiring pattern 238. The wiring pattern 238 is connected to the negative terminal 214 at its end via a plated-through hole 239. In other words, the semiconductor light emitting devices 10A, 10B and 10C are connected in parallel via the wiring patterns 236 and 238.

The LED module 200 having the above structure is attached to the illumination fixture 240 to be ready for use. The LED module 200 and the illumination fixture 240 together constitute an illumination apparatus 242.

Figure 29A:
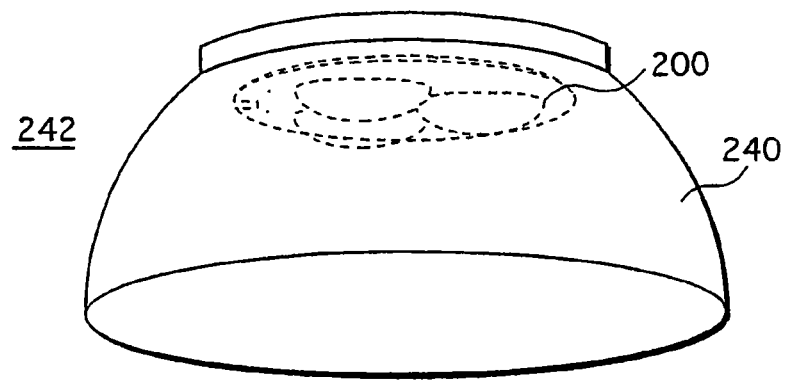
FIG. 29A is an oblique view and FIG. 29B is a bottom view of an illumination apparatus.
Figure 29B:
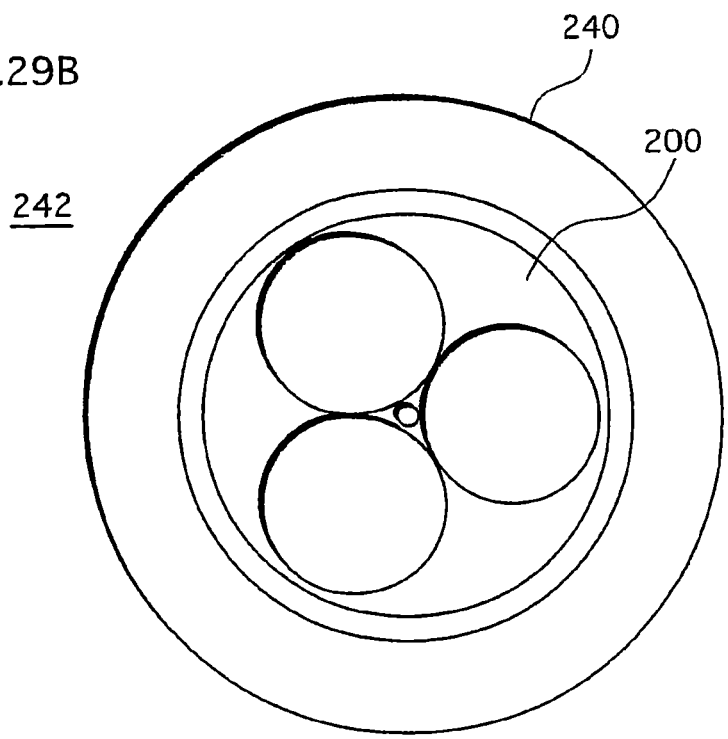

FIG. 29A is a schematic oblique view and FIG. 29B is a bottom view of the illumination apparatus 242.

The illumination fixture 240 is fixed in a ceiling of a room, for example. The illumination fixture 240 is provided with a power circuit (not illustrated) for converting an alternating current from a commercial power source (for example, 100 V, 50/60 Hz) to a direct current required to drive the LED module 200.

Figure 30:
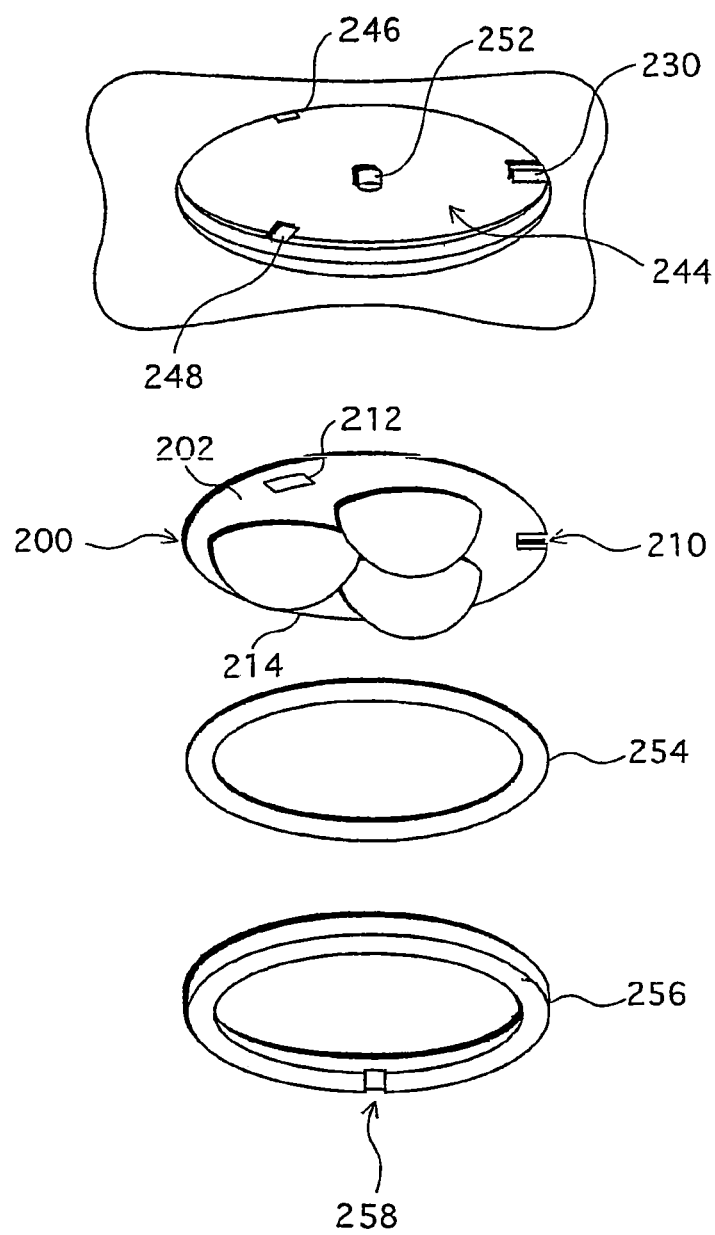
FIG. 30 is an exploded perspective view of the illumination apparatus.

With reference to FIG. 30, a description is given to the structure for attaching the LED module 200 to the illumination fixture 240.

The illumination fixture 240 has a circular recess 244 for fitting the LED module 200 therein. The circular recess 244 has a flat bottom and an inner wall that is internally threaded (not illustrated) at a portion adjacent its opening. The illumination fixture 240 also has power supply terminals 246 and 248 and a guide pawl 230 all of which have flexibility and inwardly project from points on the inner wall between the threaded portion and the bottom. The power supply terminal 246 is a positive terminal, whereas the power supply terminal 248 is a negative terminal. In addition, an upright guide pin 252 is provided at the center of the bottom of the circular recess 244.

For attachment of the LED module 200 to the illumination fixture 240, there are provided an O-ring 254 made of silicon rubber and a ring screw 256. The ring screw 256 is substantially rectangular in cross section and has an externally threaded outer surface (not illustrated). In addition, the ring screw 256 has a notch 258 formed in the circumferential direction.

Now, a description is given to an attachment procedure.

First, the LED module 200 is fit into the circular recess 244. At the time of fitting, the LED module 200 is so positioned that (i) the ceramic substrate 202 comes between the bottom surface of the circular recess 244 and the power supply terminals 246 and 248, (ii) the guide pin 252 comes to enter the guide hole 216, and (iii) the guide notch 210 engages with the guide pawl 230. Through the insertion of the guide pin 252 into the guide hole 216, the LED module 200 is axially aligned with the center of the circular recess 244. In addition, through the engagement between the guide notch 210 and the guide pawl 230, the power supply terminals 246 and 248 are properly positioned relative to the positive terminal 212 and the negative terminal 214.

After the LED module 200 is fit into the circular recess 244, the O-ring 254 is placed and the ring screw 256 is screwed into the circular recess 244 to secure the ring screw 256 in place. As a result, the positive terminal 212 and the negative terminal 214 come into intimate contact with the power supply terminals 246 and 248, respectively, thereby reliably establishing electrical connection. In addition, the substantially entire surface of ceramic substrate 202 is brought into intimate contact with the flat bottom surface of the circular recess 244. Thus, heat generated by the LED module 200 is effectively conducted to the illumination fixture 240, thereby improving cooling effect of the LED module 200. To further improve the heat conductivity between the LED module 200 and the illumination fixture 240, silicone grease may be applied to the ceramic substrate 202 and the bottom surface of the circular recess 244.

On application of an electric current from a commercial power source to the illumination apparatus 242 having the above structure, each of the LED chips 14A-14C included in each semiconductor light emitting devices 10 emit blue light. Part of the blue light is converted into yellow light by the phosphor particles contained in the phosphor 16. The blue light and yellow light is mixed to produce white light. The resulting white light is emitted through a respective one of the lenses 204, 206, and 208.

The semiconductor light emitting devices 10 included in the LED module 200 (FIG. 26) may be structured without the base substrate 12 (FIG. 1). That is, the semiconductor light emitting devices 10 may be mounted directly onto the ceramic substrate 202 (FIG. 26). Naturally, when making such a modification, it is necessary to appropriately modify the shapes of components, such as bonding pads and power supply terminals, to be disposed on the ceramic substrate 202. Here, the ceramic substrate 202 serves as the base substrate of each semiconductor light emitting device 10. In the case where the LED module 200 includes LED chips 400 or 500 each of which is not provided with a base substrate, it is applicable to directly mount the LED chips 400 or 500 onto the ceramic substrate 202 and then form a phosphor layer to cover the LED chips.

Up to this point, the present invention has been described by way of the above embodiments. It should be naturally appreciated, however, the present invention is not limited to the above specific embodiments and various modifications, including the following may be made.

In principle, each semiconductor light emitting device according to the above embodiments has a light emitting element composed of a semiconductor multilayer structure, a first electrode, and a second electrode. The semiconductor multilayer structure has the following layers in the stated order to constitute a diode: a first conductive layer of a first conductive type and made of a p-semiconductor; a light emission layer; a second conductive layer of a second conductive type and made of an n-semiconductor. The second conductive layer is disposed on a light extracting side of the light emission layer. The first and second electrodes are in contact with the first and second conductive layers, respectively. The semiconductor multilayer structure additionally has a base substrate supporting the light emitting element and a phosphor. The phosphor is disposed on the base substrate so as to cover the light emitting element and contains a phosphor material (phosphor particles) having a property of emitting light by absorbing light emitted by the light emission layer. The base substrate has a first power supply terminal and a second power supply terminal that are electrically connected to the first and second electrodes, respectively.

(1) The first conductive layer may be a p-GaN layer or a p-AlGaN layer as described above. The second conductive layer may be an n-GaN layer or an n-AlGaN layer as described above. In the case where the first conductive layer is made of a p-semiconductor, the second conductive layer needs to be made of an n-semiconductor. Reversely, in the case where the first conductive layer is made of an n-semiconductor, the second conductive layer needs to be made of a p-semiconductor.

(2) As in the above embodiment 1, an InGaN/GaN MQW light emission layer may be used as the light emission layer for emitting light ranging from blue (430-470 nm) to violet (380-430 nm). For emitting near-ultraviolet light (380 nm or shorter), an AlGaN/InGaN MQW light emission layer may be used as in the embodiment 2.

(3) The first conductive layer, the light emission layer, and the second conductive layer may be 0.1-0.5 μm thick, 0.01-0.1 μm thick, and 0.5-3 μm thick, respectively. In addition, each of the first conductive layer, the light emission layer, and the second conductive layer may be made of a single layer or multiple layers. In addition, such multiple layers may be made of mutually different compositions.

(4) As described above, the single crystal substrate is disposed in contact with a main surface of either the first or second conductive layer and used for epitaxially growing the semiconductor multilayer structure. The single crystal substrate may be any of GaN, SiC, and sapphire substrates, and the thickness may be about 0.01-0.5 mm.

(5) The materials of the first and second electrodes are not limited. Yet, it is preferable to use a metal material containing, for example, Ni or Ti, which has a relatively low contact resistance with the first or second conductive layer. For improving the light extraction efficiency of the semiconductor light emitting device, it is preferable that the first electrode in contact with the first conductive layer be made of a material reflecting light emitted from the light emission layer. For example, a stack of Rh/Pt/Au films used in the above embodiments is preferable. In the case where the second electrode is disposed on a main surface of the second conducive layer serving as a light extracting surface, it is preferable that the second electrode be made of a transparent conductive material, such as ITO, for improving light extraction efficiency. Each of the first and second electrodes may be 0.01-3 μm thick.

(6) The material of the base substrate is not specifically limited. For example, the base substrate may be mainly made of a semiconductor such as Si or SiC, a ceramic such as $Al_2O_3$ or AlN, or a metal such as Au, Al, or Cu. In the case where the base substrate is made of a semiconductor or a metal and thus needs to be insulated, it is applicable to dispose an additional layer on the base substrate for insulation. Such an additional layer may be made of: an oxide or nitride, such as a silicon oxide or a silicon nitride; a resin, such as epoxy; a composite material containing a resin, such epoxy, and particles of a metal oxide, such as alumina; or a glass material.

In the case where the base substrate is made of a semiconductor material such as Si, an electronic circuit may be integrally formed with the base substrate. The electronic circuit is for controlling a supply voltage and current to the semiconductor multilayer structure. In addition, it is applicable, regardless of the substrate material, to provide electronic components on or within the base substrate. The base substrate may be about 0.1-1 mm thick. Preferably, the base substrate is mainly made of a material of which thermal conductivity is 1 W/K·m or higher, more preferably 10 W/K·m or higher, or even more preferably 100 W/K·m or higher. In addition, the shape of main surfaces of the base substrate is not limited to a rectangle, which is commonly used. Instead, the main surfaces may be in a polygonal shape, such as a hexagon used in the embodiment 1, or in a circular shape.

In the case where the base substrate of the embodiment 1 or 2 is made of an HCP crystal substrate, the HCP crystal substrate can be divided into base substrates each having a substantially hexagonal shape, without wasting the HCP crystal substrate except along the periphery where no more regular hexagonal areas can be formed. That is, similarly to embodiments 3 and 4, the better use of the HCP crystal substrate is ensured in manufacturing the base substrates of embodiments 1 and 2.

(7) The phosphor is made of a resin, such as silicone or epoxy, or a glass in which powder of phosphor materials is dispersed. The phosphor powder emits light by absorbing light emitted from the light emission layer. Examples of phosphor materials emitting red light include $(Ca,Sr)S:Eu^{2+}$, $Sr_2Si_5N_8:Eu^{2+}$, $BaSi_7N_{10}:Eu^{2+}$, $CaAlSiN_3:Eu^{2+}$, $La_2O_2S:Eu^{3+}$, and $Y_2O_2S:Eu^{3+}$. Examples of phosphor materials emitting yellow light include $(Sr,Ba)_2SiO_4:Eu^{2+}$, $(Y,Gd)_3Al_5O_{12}:Ce^{3+}$. Examples of phosphor materials emitting green light include $(Ba,Sr)_2Si_4:Eu^{2+}$, $Y_3(Al,Ga)_5O_{12}:Ce^{3+}$, $SrAl_2O_4:Eu^{2+}$, $BaMgAl_{10}O_{17}:Eu^{2+}$, or $Mn^{2+}$. Examples of phosphor materials emitting blue light include $(Ba,Sr)MgAl_{10}O_{17}:Eu^{2+}$, $Mn^{2+}$, $(Sr,Ca)_{10}(PO_4)_6Cl_2:Eu^{2+}$.

In the case where the light emission layer emits blue light, the phosphor needs to at least contain, in addition to a phosphor material emitting yellow light, a phosphor material emitting red light. As a result, the blue light is mixed with the yellow light and the red light, so that the phosphor emits white light. In the case where the light emission layer emits violet or near-ultraviolet light, the phosphor needs to at least contain, in addition to phosphor materials emitting blue and yellow light, phosphor materials emitting red and green light. As a result, the blue, green, yellow, and red light is mixed, so that the phosphor emits white light.

(8) In the embodiments 1 and 2 above, the cleavage guide grooves are formed in the main surface of the single crystal substrate facing away from the semiconductor multilayer structure. Yet, it is applicable, as shown in the embodiments 3 and 4, to form the guide grooves of the embodiments 1 and 2 in the main surface of the single crystal substrate facing toward the semiconductor multilayer structure.

The reverse may hold as well. In the embodiments 3 and 4, the cleavage guide grooves are formed in the main surface of the single crystal substrate facing toward the semiconductor multilayer structure. Yet, it is applicable, as shown in the embodiments 1 and 2, to form the guide grooves of the embodiments 3 and 4 in the main surface of the single crystal substrate facing away from the semiconductor multilayer structure.

It is also applicable to form the guide grooves in both main surfaces of the single crystal substrate.

Similar description applies to the holes (holes 162, see FIG. 17) formed for cleavage in addition to the guide grooves, in the case where the holes are non-through holes. That is, the holes may be formed in either or both main surfaces of the single crystal substrate.

(9) In addition to GaN, SiC, and sapphire substrates, AlN, ZnO, BN, and MgO are known to be usable materials for a semiconductor multilayer structure (epitaxial layer) as well as for a substrate used for epitaxial growth of the semiconductor multilayer structure. The present invention is applicable to any of these materials as long as the material has an HCP single crystal structure.

(10) In the above embodiments, the descriptions are given by way of blue LED and UV LED chips as examples of the semiconductor light emitting elements. Needless to say, however, the present invention is not limited to any specific emission color. As long as the semiconductor multilayer structure (epitaxial layer) and the single crystal substrate are of an HCP single crystal structure, the present invention is applicable irrespective of the emission color.

(11) In the embodiments 1 and 2, the LED chips are used in combination with a phosphor. Yet, also in the case of LED chips used without provision of a phosphor, a semiconductor light emitting device producing a beam spot closer to a circle is manufactured, while ensuring the best possible use of the semiconductor material.

INDUSTRIAL APPLICABILITY

A semiconductor light emitting device according to the present invention is suitably applicable to the fields of illumination in which a beam spot is desired to be as closer to a circle as possible. The fields of illumination cover indoor illumination as well as outdoor illumination including streetlights and vehicle headlights.

The invention claimed is:

1. A semiconductor light emitting device comprising:
a single crystal substrate with a hexagonal closest-packed crystal structure having a (0001) plane on a main surface; and
a semiconductor multilayer structure that includes a light emission layer and is formed on the main surface of the single crystal substrate; where
in plan view, the single crystal substrate has a hexagonal shape with each vertex cut away to leave an arc-shaped recess that curves inward towards the center of the single crystal substrate, and each side surface of the single crystal substrate is a cleavage plane.

2. The semiconductor light emitting device according to claim 1, wherein the single crystal substrate is made of one of GaN and SiC.

3. The semiconductor light emitting device according to claim 2, further comprising:
a first electrode formed on a second main surface of the semiconductor multilayer structure facing away from the single crystal substrate; and
a second electrode formed on a main surface of the single crystal substrate facing away from the semiconductor multilayer structure.

4. The semiconductor light emitting device according to claim 3, Wherein in plan view, the semiconductor multilayer structure has a hexagonal shape that is slightly smaller than the single crystal substrate.

5. The semiconductor light emitting device according to claim 4, wherein the first electrode includes:
a transparent electrode which is a coating formed on the main surface of the semiconductor multilayer structure; and
a contact electrode formed on the transparent electrode, wherein
the contact electrode is composed of a hexagonal rim portion and spoke portions radially extending from a center of the contact electrode to vertexes of the hexagonal rim.

6. The semiconductor light emitting device according to claim 1, wherein in plan view, the semiconductor multilayer structure has a hexagonal shape that is slightly smaller than the single crystal substrate.

7. The semiconductor light emitting device according to claim 6, further comprising:
a transparent electrode formed on a main surface of the semiconductor multilayer structure facing away from the single crystal substrate; and
a contact electrode formed on the transparent electrode, wherein
the contact electrode is comprised of a hexagonal rim portion and a spoke portion extending from a center of the contact electrode to the vertexes of the hexagonal rim.

8. The semiconductor light emitting device according to claim 1, further comprising:
a first electrode formed on a second main surface of the semiconductor multilayer structure facing away from the single crystal substrate; and
a second electrode formed on a main surface of the single crystal substrate facing away from the semiconductor multilayer structure.

9. The semiconductor light emitting device according to claim 1, further comprising:
a transparent electrode formed on a main surface of the semiconductor multilayer structure facing away from the single crystal substrate; and
a contact electrode formed on the transparent electrode, wherein
the contact electrode is composed of a hexagonal rim portion and a spoke portion extending from a center of the contact electrode to the vertexes of the hexagonal rim.

10. A semiconductor light emitting device comprising:
a single crystal substrate with a hexagonal closest-packed crystal structure having a (0001) plane on a main surface; and
a semiconductor multilayer structure that includes a light emission layer and is formed on the main surface of the single crystal substrate; where
in plan view, the single crystal substrate has a hexagonal shape with each vertex cut away to leave an arc-shaped recess that curves inward towards the center of the single crystal substrate, the arc-shaped recesses are only provided on the single crystal substrate, and each side surface of the single crystal substrate is a cleavage plane.

11. The semiconductor light emitting device according to claim 10, wherein the single crystal substrate is made of one of GaN and SiC.

12. The semiconductor light emitting device according to claim 11, further comprising:
a first electrode formed on a second main surface of the semiconductor multilayer structure facing away from the single crystal substrate; and
a second electrode formed on a main surface of the single crystal substrate facing away from the semiconductor multilayer structure.

13. The semiconductor light emitting device according to claim 12, wherein in plan view, the semiconductor multilayer structure has a hexagonal shape that is slightly smaller than the single crystal substrate.

14. The semiconductor light emitting device according to claim 13, wherein the first electrode includes:
- a transparent electrode which is a coating formed on the main surface of the semiconductor multilayer structure; and
- a contact electrode formed on the transparent electrode, wherein the contact electrode is composed of a hexagonal rim portion and spoke portions radially extending from a center of the contact electrode to vertexes of the hexagonal rim.

15. The semiconductor light emitting device according to claim 10, wherein in plan view, the semiconductor multilayer structure has a multi layer hexagonal shape that is slightly smaller than the single crystal substrate with each vertex of the multilayer hexagonal shape aligned with an arc-shaped recess of the single crystal substrate.

16. The semiconductor light emitting device according to claim 15, further comprising:
- a transparent electrode formed on a main surface of the semiconductor multilayer structure facing away from the single crystal substrate; and
- a contact electrode formed on the transparent electrode, wherein the contact electrode is comprised of a hexagonal rim portion and a spoke portion extending from a center of the contact electrode to the vertexes of the hexagonal rim of the multilayer hexagonal shape.

17. The semiconductor light emitting device according to claim 10, further comprising:
- a first electrode formed on a second main surface of the semiconductor multilayer structure facing away from the single crystal substrate; and
- a second electrode formed on a main surface of the single crystal substrate facing away from the semiconductor multilayer structure.

18. The semiconductor light emitting device according to claim 10, further comprising:
- a transparent electrode formed on a main surface of the semiconductor multilayer structure facing away from the single crystal substrate; and
- a contact electrode formed on the transparent electrode, wherein the contact electrode is composed of a hexagonal rim portion and a spoke portion extending from a center of the contact electrode to the vertexes of the hexagonal rim.

* * * * *